United States Patent
Urata et al.

(10) Patent No.: US 7,120,890 B2
(45) Date of Patent: Oct. 10, 2006

(54) APPARATUS FOR DELAY FAULT TESTING OF INTEGRATED CIRCUITS

(75) Inventors: Koji Urata, Saitama (JP); Kenichi Anzou, Kawasaki (JP); Tetsu Hasegawa, Kawasaki (JP); Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 10/695,698

(22) Filed: Oct. 28, 2003

(65) Prior Publication Data
US 2005/0010886 A1 Jan. 13, 2005

(30) Foreign Application Priority Data
Oct. 28, 2002 (JP) ............... P2002-313172

(51) Int. Cl.
*G06F 17/50* (2006.01)
(52) U.S. Cl. ............................. 716/12; 716/5
(58) Field of Classification Search ............... 716/4–5, 716/7, 12
See application file for complete search history.

(56) References Cited

U.S. PATENT DOCUMENTS

| 5,583,787 | A | * | 12/1996 | Underwood et al. ......... 716/6 |
| 5,920,490 | A | | 7/1999 | Peters |
| 2003/0056163 | A1 | * | 3/2003 | Rajsuman et al. .......... 714/724 |
| 2003/0083855 | A1 | * | 5/2003 | Fukuyama .................. 703/15 |

FOREIGN PATENT DOCUMENTS

| JP | 3-286376 | 12/1991 |
| JP | 05-150007 | 6/1992 |
| JP | 05-264676 | 10/1993 |
| JP | 09-026986 | 1/1997 |
| JP | 11-052030 | 2/1999 |
| JP | 11-160400 | 6/1999 |
| JP | 11-295390 | 10/1999 |
| JP | 2001-051027 | 2/2001 |
| JP | P2002-183233 A | 6/2002 |

OTHER PUBLICATIONS

Fetherston, et al., "Testability Features Of The AMD-K6 Microprocessor," IEEE Design & Test of Computers, US, IEEE, 1998, vol. 15, No. 3, pp. 64-69, ISSN:0740-7475.

* cited by examiner

*Primary Examiner*—Stacy A Whitmore
(74) *Attorney, Agent, or Firm*—DLA PiperRRudnick Gray Cary US LLP

(57) ABSTRACT

A method for generating a test vector of an IC including: designating a retrieval condition to select a path on which a signal can be transmitted in the circuit; executing a timing analysis of the circuit based on a circuit information of the circuit, retrieving the path satisfying the retrieval condition, and generating a path list in which cells composing the retrieved path are put in order of executing the timing analysis; generating a test vector to test a path delay fault of the circuit based on the path list; designating an ending condition to end generation of the test vector when the path in the path list for the test vector is distributed over the circuit; and stopping generation of the path list when the ending condition is satisfied.

20 Claims, 31 Drawing Sheets

FIG. 15

| ITEM | RANGE |
| --- | --- |
| TOTAL NUMBER OF STEPS FOR PATH | 10 STEPS OR MORE |
| NUMBER OF LOGIC ELEMENTS WHICH VECTOR PASSES | 300 GATES OR MORE |
| NUMBER OF VIAS | 1000 PIECES OR MORE |

| ITEM | RANGE |
| --- | --- |
| NUMBER OF TEST VECTORS | 20 OR MORE |
| NUMBER OF LOGIC ELEMENTS WHICH TEST VECTOR PASSES | 200 GATES OR MORE |

```
//TCLK_TCLK05.path1_tg_import ─────────────────────── ○ PATH 1-1
$path{
  $transition{
    "CLTOP/peace/cengen/cen_cengen/T_BRCNT_regX1X/Q"v;//(GFD1EX2) ── ○ CELL 1-1
    "CLTOP/peace/cengen/cen_cengen/U168/Z"^;//(GNR2X1) ──────── ○ CELL 1-2
    "CLTOP/peace/cengen/cen_cengen/U191/Z"v;//(GIVX1) ──────── ○ CELL 1-3
    "CLTOP/peace/cengen/cen_cengen/U169/Z"v;//(GOR3X1) ──────── ○ CELL 1-4
    "CLTOP/peace/cengen/cen_cengen/U170/Z"^;//(GNR2X1) ──────── ○ CELL 1-5
    "CLTOP/peace/cengen/cen_cengen/U192/Z"v;//(GIVX1) ──────── ○ CELL 1-6
    "CLTOP/peace/cengen/cen_cengen/U171/Z"v;//(GOR3X1) ──────── ○ CELL 1-7
    "CLTOP/peace/cengen/cen_cengen/U172/Z"^;//(GNR2X1) ──────── ○ CELL 1-8
    "CLTOP/peace/cengen/cen_cengen/U173/Z"v;//(GND2X1) ──────── ○ CELL 1-9
    "CLTOP/peace/cengen/cen_cengen/U174/Z"^;//(GNR2X1) ──────── ○ CELL 1-10
    "CLTOP/peace/cengen/cen_cengen/U225/Z"v;//(GANR1X1) ──────── ○ CELL 1-11
    "CLTOP/peace/cengen/cen_cengen/U175/Z"^;//(GND2X1) ──────── ○ CELL 1-12
    "CLTOP/peace/cengen/cen_cengen/U195/Z"v;//(GIVX1) ──────── ○ CELL 1-13
    "CLTOP/peace/cengen/cen_cengen/U176/Z"^;//(GND2X1) ──────── ○ CELL 1-14
    "CLTOP/peace/cengen/cen_cengen/U188/Z"v;//(GIVX1) ──────── ○ CELL 1-15
    "CLTOP/peace/cengen/cen_cengen/U205/Z"^;//(GND2X1) ──────── ○ CELL 1-16
    "CLTOP/peace/cengen/cen_cengen/U210/Z"^;//(GMX2X1) ──────── ○ CELL 1-17
    "CLTOP/peace/cengen/cen_cengen/U151/Z"v;//(GOND1X1) ──────── ○ CELL 1-18
    "CLTOP/peace/cengen/cen_cengen/T_BRCNT_regX5X/D"v;//(GFD1EX2) ── ○ CELL 1-19
  }
}
```

| ITEM | SITUATIONS |
|---|---|
| NUMBER OF INPUT PATH | 10 |
| NUMBER OF GENERATED TEST-VECTORS | 5 |
| NUMBERS OF PATHS UNDER SUCCESS IN GENERATION OF TEST VECTORS | 1, 4, 5, 7, 8 |
| NUMBERS OF PATHS UNDER FAIL IN GENERATION OF TEST VECTORS | 2, 3, 6, 9, 10 |
| NAME OF TEST VECTOR | pat1, pat4, pat5, pat7, pat8 |

| ITEM | RANGE |
|---|---|
| NUMBER OF PATHS PASSING IN REGION | 3 OR MORE |
| TOTAL WIRING LENGTH CONNECTED TO PATH | 2 mm OR MORE |

| ITEM | RANGE |
|---|---|
| COVERAGE RATE | 70% OR MORE |
| TOTAL NUMBER OF STEPS FOR PATH | 7 STEPS OR MORE |
| NUMBER OF LOGIC ELEMENTS WHICH TEST VECTOR PASSES | 200 GATES OR MORE |
| NUMBER OF VIAS | 500 PIECES OR MORE |

| ITEM | RANGE |
|---|---|
| COVERAGE RATE | 70% |
| NUMBER OF TEST VECTORS | 30 OR MORE |
| NUMBER OF LOGIC ELEMENTS WHICH TEST VECTOR PASSES | 300 GATES OR MORE |

145            146

| CELL/PIN NAME | X COORDINATE (um) | Y COORDINATE (um) | WIRING LENGTH(mm) | NUMBER OF CONTACTS | NUMBER OF VIAS |
|---|---|---|---|---|---|
| CLTOP/peace/U268/Z | 1520 | 950 | 0.25 | 7 | 8 |
| CLTOP/peace/U191/Z | 780 | 330 | 0.22 | 12 | 6 |
| CLTOP/cengen/U33/Z | 120 | -110 | 0.15 | 9 | 10 |
| CLTOP/cengen/U135/Z | -520 | 220 | 0.18 | 5 | 8 |
| CLTOP/pcitag/U256/Z | -70 | -35 | 0.32 | 6 | 12 |

158 = CELL/PIN NAME column; 159 = remaining columns

| ITEM | RANGE |
|---|---|
| COVERAGE RATE | 40% OR MORE |
| NUMBER OF STEPS FOR PATH | 5 STEPS OR MORE |

160 = ITEM column; 161 = RANGE column

FIG. 34

| |
|---|
| ### Path Delay Test Start ### |
| Test No.701<br>Pattern Name : Pat1<br>  Pass, Delay Time = 7.5nsec |
| Test No.702<br>Pattern Name : Pat2<br>  Fail, Delay Time = 17.2nsec |
| Test No.703<br>Pattern Name : Pat3<br>  Pass, Delay Time = 9.3nsec |
| Test No.704<br>Pattern Name : Pat4<br>  Fail, Delay Time = 14.8nsec |
| Test No.705<br>Pattern Name : Pat5<br>  Pass, Delay Time = 8.3nsec |
| ### Path Delay Test End ### |

Tests 701–705 } 165

FIG. 35

| NAME OF CIRCUIT-IDENTIFIER FOR CELL | NAME OF CELL |
|---|---|
| CLTOP/iresgen/XRESET_reg12/QN | GFD2EX1 |
| CLTOP/iresgen/U45/Z | GND4X1 |
| CLTOP/ope_pr/U88/Z | GIVX1 |
| CLTOP/ope_pr/U89/Z | GIVX1 |
| CLTOP/ope_pr/OPPR_creg/U826/Z | GIVX2 |
| CLTOP/ope_pr/OPPR_creg/U123/Z | GND2X4 |
| CLTOP/ope_pr/intc_main/SINT_reg23/D | GFD1EX1 |

| ITEM | RANGE |
|---|---|
| NUMBER OF SHARING STEPS FOR PATH | 3 STEPS OR MORE |
| WIRING LENGTH | 1.5 MM OR MORE |
| NUMBER OF VIAS | 30 PIECES OR MORE |

| ITEM | RANGE |
|---|---|
| SHARING RATE OF PATH | 80% OR MORE |
| NUMBER OF TEST VECTORS | 10 OR MORE |

| NAME OF CIRCUIT IDENTIFIER FOR CELL | X COORDINATE (um) | Y COORDINATE (um) |
|---|---|---|
| CLTOP/pcitarg_p_ext/wfifo2_reg_reg/CP | 2340 | 10030 |
| CLTOP/pcitarg_p_ext/wfifo2_reg_reg/QN | 1520 | 210 |
| CLTOP/pcitarg_p_ext/U3687/Z | 780 | -180 |
| CLTOP/pcitarg_p_ext/U4622/Z | -120 | -330 |
| CLTOP/pcitarg_p_ext/U2573/Z | -690 | 650 |

Columns grouped: 176 (NAME OF CIRCUIT IDENTIFIER FOR CELL); 177 (X COORDINATE, Y COORDINATE)

APPARATUS FOR DELAY FAULT TESTING OF INTEGRATED CIRCUITS

CROSS REFERENCE TO RELATED APPLICATIONS

This application is based upon and claims the benefit of priority from the prior Japanese Patent Application No. P2002-313172, filed on Oct. 28, 2002; the entire contents of which are incorporated herein by reference.

BACKGROUND OF THE INVENTION

1. Field of the Invention

The invention relates to a delay fault test of a semiconductor integrated circuit (IC). More particularly, the invention relates to generating a test vector, and executing a delay fault test with the test vector.

2. Description of the Related Art

Verification of functions and timing in an IC, and especially logic circuits, is typically performed by simulation. Such simulations often employ test vectors to activate a critical path that has been identified by the timing analysis.

Current verification efforts often result in incomplete testing of an IC, though. Verification often focuses on paths with large signal delays, thus centering only on specific circuit blocks or regions known to have large delays. Also, due to dispersion of size and density in manufacturing of an IC, paths which are assumed at verification of timing during a design stage to easily breach timing may not necessarily become an actual breach path after the IC is actually manufactured. The timing breach, if any, may actually be generated on a different path.

Accordingly, it is desirable to execute the delay fault test on a path which is selected so as to cover a large area of the IC. In particular, it is desirable to develop an apparatus that allows users to designate a specific region of an IC, and that generates a test vector by which the specified region is tested.

SUMMARY OF THE INVENTION

An aspect of the present invention inheres in an apparatus for generating a test vector of an IC according to embodiments of the present invention. The apparatus includes a retrieval-condition designation section designating a retrieval condition configured to select a path on which a signal can be transmitted in the semiconductor integrated circuit. It also includes a path-list generation section executing a timing analysis of the semiconductor integrated circuit based on circuit information of the semiconductor integrated circuit, retrieving the path satisfying the retrieval condition, and generating a path list in which cells composing the retrieved path are ordered according to the timing analysis. Also included is a test-vector generation section generating a test vector configured to test a path delay fault of the semiconductor integrated circuit based on the path list. An ending-condition designation section designates an ending condition configured to end generation of the test vector when the path in the path list for the test vector covers the semiconductor integrated circuit, and an ending-condition judgment section stops generation of the path list when the ending condition is satisfied.

Another aspect of the present invention inheres in an apparatus for debugging an failure of an IC according to embodiments of the present invention. The apparatus includes a cell-list generation section generating a list of cells composing a path in the semiconductor integrated circuit with a delay fault based on a test result of whether the delay fault is generated on the path. It also includes a retrieval-condition designation section designating a retrieval condition configured to retrieve a fault-cell searching path, which includes a part of the path with the delay fault. A path-list generation section is included for fault-cell searching, which retrieves the fault-cell searching path based on the retrieval condition, and generates a fault-cell searching path list in which cells composing the retrieved fault-cell searching path are ordered according to the transmission of a signal by the cells composing the retrieved fault-cell searching path. A test-vector generation section is included for fault-cell searching, which generates a test vector based on the fault-cell searching path list. Also, an ending-condition designation section designates an ending condition configured to end generation of the test vector, and an ending-condition judgment section stops generation of the path list when the ending condition is satisfied.

Still another aspect of the present invention inheres in a computer-implemented method for generating a test vector of an IC according to embodiments of the present invention. The method includes designating a retrieval condition configured to select a path on which a signal can be transmitted in the semiconductor integrated circuit. The method also includes executing a timing analysis of the semiconductor integrated circuit based on circuit information of the semiconductor integrated circuit, retrieving the path satisfying the retrieval condition, and generating a path list in which cells composing the retrieved path are ordered according to the timing analysis. The method also includes generating a test vector configured to test a path delay fault of the semiconductor integrated circuit based on the path list. The method also includes designating an ending condition configured to end generation of the test vector when the path in the path list for the test vector covers the semiconductor integrated circuit, and stopping generation of the path list when the ending condition is satisfied.

Still another aspect of the present invention inheres in a computer program product to be executed by a computer for generating a test vector of an IC according to embodiments of the present invention. The program product includes instructions designating a retrieval condition configured to select a path on which a signal can be transmitted in the semiconductor integrated circuit. Also included are instructions executing a timing analysis of the semiconductor integrated circuit based on circuit information of the semiconductor integrated circuit, retrieving the path satisfying the retrieval condition, and generating a path list in which cells composing the retrieved path are ordered according to the timing analysis. Also included are instructions generating a test vector configured to test a path delay fault of the semiconductor integrated circuit based on the path list. Also included are instructions designating an ending condition configured to end generation of the test vector when the path in the path list for the test vector covers the semiconductor integrated circuit, and instructions stopping generation of the path list when the ending condition is satisfied.

BRIEF DESCRIPTION OF THE DRAWINGS

FIG. 15 is a data structure of a retrieval condition for a test-vector generating method according to an example 1 of the first embodiment;

FIG. 16 is a data structure of an ending condition for the test-vector generating method according to the example 1 of the first embodiment;

FIG. 17 is a data structure of a path list for the test-vector generating method according to the example 1 of the first embodiment;

FIG. 18 is a data structure of test-vector generation information for the test-vector generating method according to the example 1 of the first embodiment;

FIG. 24 is a data structure of definition of coverage for the test-vector generating method according to the example 2 of the first embodiment;

FIG. 25 is a data structure of a retrieval condition, including a coverage rate, for the test-vector generating method according to the example 2 of the first embodiment;

FIG. 26 is a data structure of an ending condition, including the coverage rate, for the test-vector generating method according to the example 2 of the first embodiment;

FIG. 34 is a data structure of a test result of a fault analysis method of an IC according to an example 1 of the second embodiment;

FIG. 35 is a data structure of a cell list for the fault analysis method of an IC according to the example 1 of the second embodiment;

FIG. 36 is a data structure of a retrieval condition for the fault analysis method of an IC according to the example 1 of the second embodiment;

FIG. 37 is a data structure of an ending condition for the fault analysis method of an IC according to the example 1 of the second embodiment;

FIG. 40 is a data structure of a pin-coordinate information for a fault analysis method of an IC according to an example 2 of the second embodiment;

DETAILED DESCRIPTION OF THE INVENTION

Figure 1:
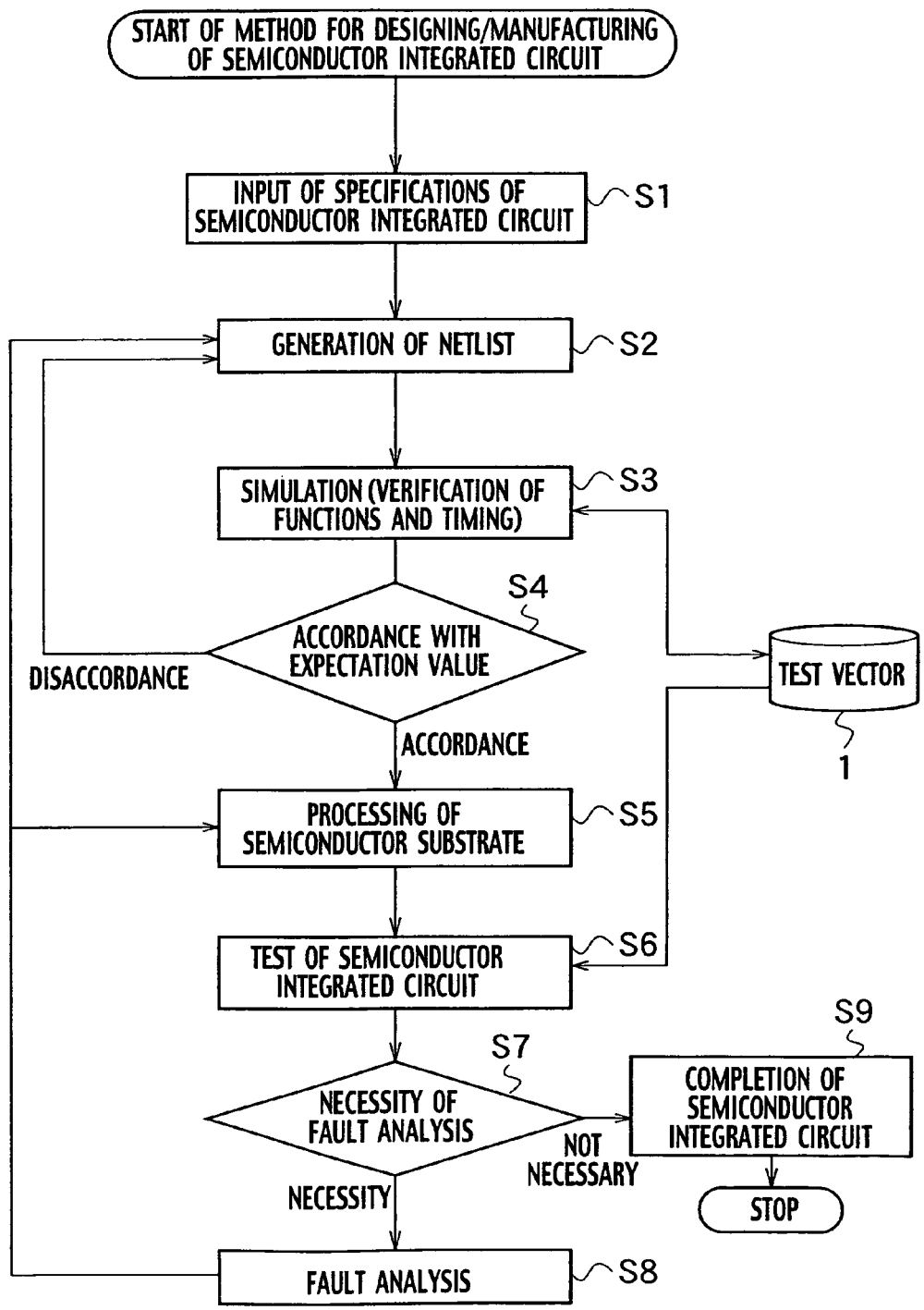
FIG. 1 is a flow chart of a manufacturing method of an IC according to a first embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

FIG. 1 illustrates a method for designing and manufacturing an IC according to a first embodiment. Specifications of the IC are input (STEP S1). A logic synthesis is then executed, based on the specifications of STEP S1, in order to generate a logical expression (STEP S2). Based on this logical expression, a netlist is generated, using circuit blocks and cells. Circuit blocks and cells are placed and routed based on the netlist, so as to generate a layout pattern of the IC.

A test pattern is then generated (STEP S3). A test vector 1 is generated, based on the test pattern. The test vector 1 is the mechanism by which a specific region is tested. As will be further discussed below, the test vector 1 is generated by designating a specific region on the IC, to ensure maximum coverage of the IC.

The test vector 1 includes; a preparation vector; a system clock vector; and a detection vector. The preparation vector sets initial logical-values of external pins and internal pins of the IC. Using the system clock vector, control signals are input to the IC, not only from the clock line, but also from arbitrary external pins and arbitrary internal pins. As known to one of ordinary skill in the art, the preparation vector and system clock vector thus allow for activation of a desired path in the IC, and for operation of the cells and the circuit blocks on that path. The detection vector contains the values which are expected to be output from the cells and the circuit blocks, once they have been operated based on the preparation vector and the system clock vector.

A determination is then made whether logical values output based on the preparation vector and the system clock vector are in agreement with the expected values of the detection vector (STEP S4). If there is agreement between the output values and the expected values, processing proceeds to STEP S5. If not, processing returns to STEP S2. At STEP S5, a semiconductor substrate is processed and the IC for which operation tests can be conducted is manufactured.

The delay fault test of the manufactured IC is executed at STEP S6, using the test vector 1. The delay fault test is especially useful for testing critical circuit paths identified in STEP S3. More specifically, the test vector 1 can be used to test any specific region on the IC, i.e., it may be generated in order to execute the delay fault test over the entire area of the IC, to the extent possible.

The delay fault test is, in some regards, a test for confirming whether signals corresponding to the expectation values are output or not within a predetermined delay time. This predetermined delay time is commonly defined as a duration over which there is no breach in the operation frequency of the IC, and can be determined in any known manner. The test vector that activates the critical path for the delay fault test may be generated at STEP S6.

It is then determined whether a delay fault occurs (STEP S7), i.e., whether the output values are received within the predetermined delay time. When a delay fault occurs, then a fault analysis is required and the processing proceeds to STEP S8. When a delay fault does not occur, a fault analysis is not required and the processing proceeds to STEP S9, upon which the IC is completed.

Fault analysis of the circuit path on which the delay fault occurs is executed at STEP S8. In the fault analysis, the fault path can be estimated using the test vectors that produced the delay fault, and corresponding circuit information on the IC. Alternatively, the fault path can be identified using a path input at generation of the test vector that led to the delay fault.

In order to determine or judge which circuit blocks and cells of the IC have been tested by the fault path, the fault path can be overlaid on the layout pattern of the IC. In this manner, it is often possible to at least determine an area in which the fault path exists, if not trace the fault path exactly.

However, it is sometimes impossible to identify exactly which cells caused the delay fault, because the fault path sometimes includes a plurality of connected cells. In order to determine the cell which causes the delay fault, a different circuit path is tested. This new circuit path includes a portion of the cells along the fault path. A test vector is generated for activating the new path, and a delay fault test is executed using the new test vector.

Test vectors for a plurality of paths, each of which shares respectively different parts of the cells with the fault path, can be sequentially generated. By determining which of these new paths produce a failure and which do not, the range of cells which cause failure is narrowed to eventually specify the failing cell.

(Apparatus for Generating a Test Vector)

Figure 2:
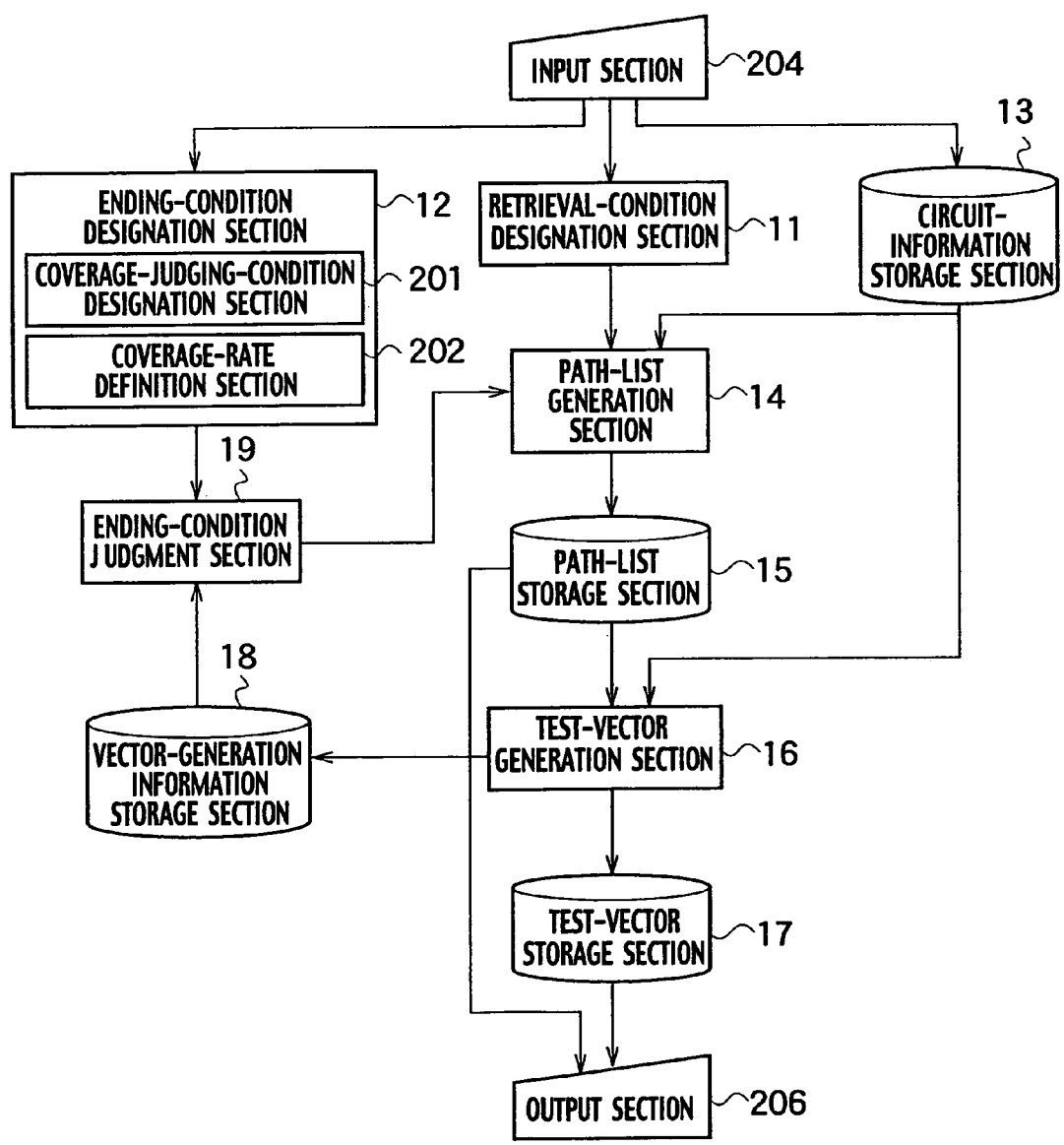
FIG. 2 is a block diagram of an apparatus for generating a test vector according to the first embodiment.

An apparatus for generating a test vector according to the first embodiment is shown in FIG. 2. The computer includes: a retrieval-condition designation section 11; an ending-condition designation section 12; a circuit-information storage section 13; a path-list generation section 14; a path-list storage section 15; a test-vector generation section 16; a test-vector storage section 17; a test-vector-generation information storage section 18; an ending-condition determination or judgment section 19; an input section 204; and an output section 206. One of ordinary skill in the art will realize that the term "section," as used here, refers simply to the appropriate portion of a computer. For example, the circuit-information storage section 13 can be any computer memory, and the ending-condition determination or judgement section 19 can be any processor or portion thereof.

The retrieval-condition designation section 11 designates a retrieval condition for selecting a path along which a signal can be transmitted in the IC. That is, paths are selected at least partly according to whether they satisfy the retrieval condition. The circuit-information storage section 13 records information on the various circuits of the IC, for use in accordance with the invention.

The path-list generation section 14 generates circuit paths. A timing analysis is executed, based on the circuit information stored in the circuit-information storage section 13. A path satisfying the retrieval conditions is retrieved, and a path-list is generated, in which the cells forming this retrieved path are arranged in the order of their execution in the timing analysis. The path-list storage section 15 records the generated path-list.

The test-vector generation section 16 generates the test vector 1 and associated test-vector-generation information needed for the delay fault test. The test vector 1 is then stored in the test-vector storage section 17, while the associated test-vector-generation information is stored in the test-vector-generation information storage section 18.

The ending-condition designation section 12 designates an ending condition for ending generation of the test vector 1. The ending-condition designation section 12 also includes a coverage-judging-condition designation section 201 and a coverage-rate definition section 202. When the ending condition is satisfied in the ending-condition determination section 19, generation of the path-list in the path-list generation section 14 is stopped.

The coverage-judging-condition designation section 201 divides the IC into a plurality of regions, and designates a coverage determining condition for determining whether a region is covered by the path-list path (i.e., the base of the generated test vector). The ending-condition determination section 19 determines covered regions by assuming that the coverage judging condition is treated as an ending condition, i.e., it determines the regions that satisfy the coverage judging condition. The path-list generation section 14 and the test-vector generation section 16 determine covered regions, assuming that the coverage judging condition is treated as a retrieval condition, and extract a path-list or a test vector of a path which is judged to be covered. A coverage judging condition considers several factors. For example, the number of paths passing the region, the logic elements in the path in the region, the wiring length of the path, the number of vias and contacts being larger than a predetermined value, whether a layer of wiring on the path and via is a predetermined layer, etc. Tests can be suitably executed for each region employing the concept of coverage. That is, it is difficult to execute suitable testing of a region, using a test vector for one path, when the path passes very close to the edge of the region. Suitable testing of a region requires that the tested path actually pass through at least some portion of the region. The concept of coverage can help satisfy this requirement.

The coverage-rate definition section 202 designates the coverage rate as a ratio of the number of the regions which are calculated as covered to the total number of regions. The ending-condition designation section 12 designates the ending condition as occurring when the coverage rate exceeds a predetermined threshold value. The retrieval-condition designation section 11 designates the retrieval condition as occurring when the coverage rate of the path exceeds a predetermined coverage rate.

The input section 204 and the output section 206 are known, and exchange data between the apparatus of FIG. 2, and external devices or operators.

In operation, the computer of FIG. 2 can be employed to generate a plurality of test vectors having coverage rates larger than a predetermined value, and that therefore test large portions of the integrated circuit. The use of such test vectors allows integrated circuits to be tested more comprehensively, leading to higher quality chips.

(Test-Vector Generating Method)

Figure 3:
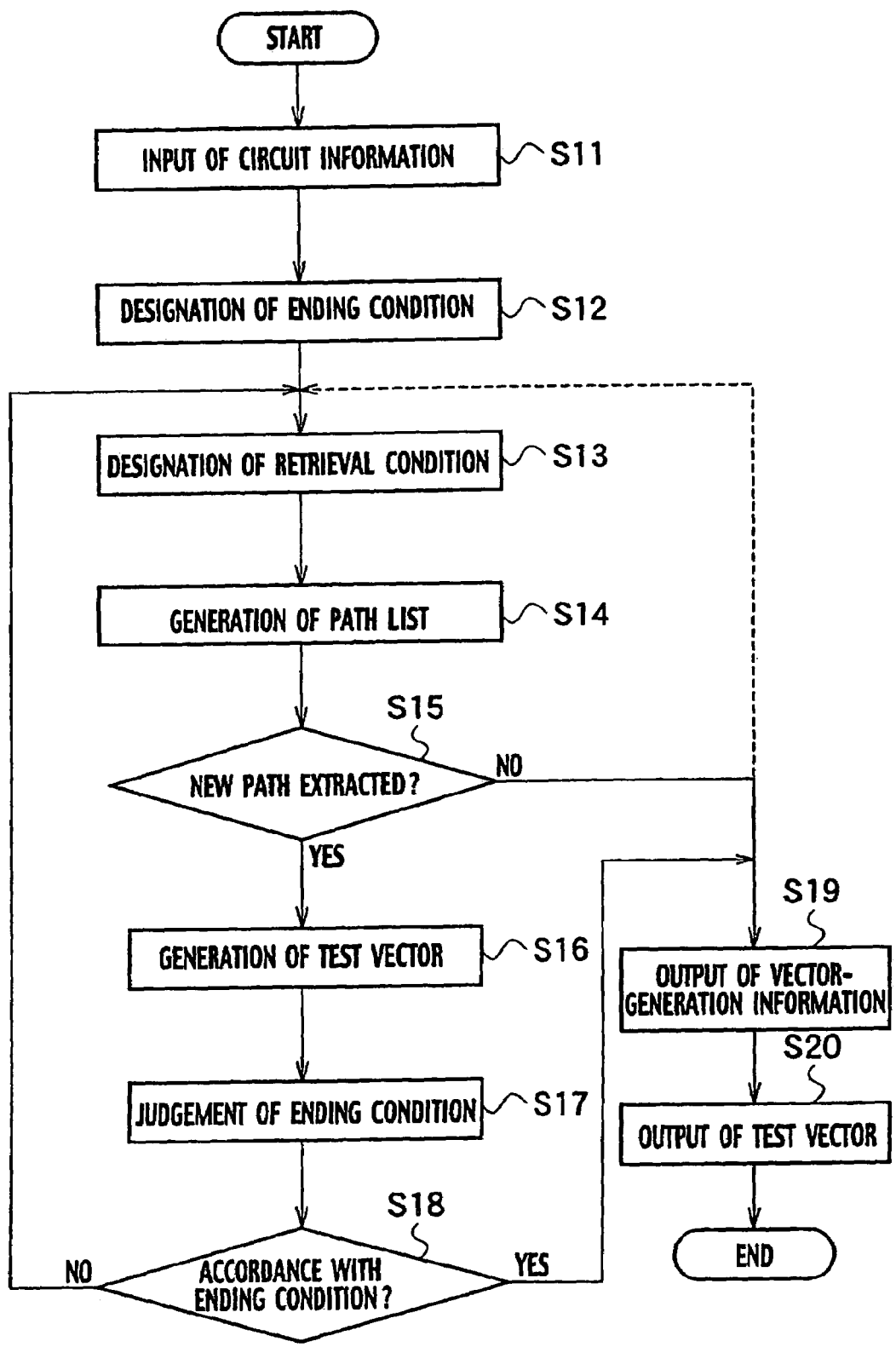
FIG. 3 is a flow chart of a test-vector generating method according to the first embodiment.

FIG. 3 illustrates steps in the generation of test vectors. The steps of FIG. 3 can be executed by a computer such as that configured as in FIG. 2. At STEP S11, circuit information is input from the circuit-information storage section 13 to the path-list generation section 14. The circuit information may be a netlist describing connecting information for the circuit blocks and the cells. When more detailed routing of layout information for the circuit blocks and the cells is desired as a retrieval condition, the circuit information may be the layout pattern of the IC, i.e., routing information for the circuit blocks and the cells.

At STEP S12, the ending-condition designation section 12 generates a condition which ends the generation process of the test vector 1. To do this, the ending-condition designation section 12 generates and designates a numerical value which is, for example, the number of test vectors 1 successfully generated, the sum of the logic elements which the generated test vectors 1 pass, or the sum of the start points and the end points at which the generated test vectors 1 are required to exceed predetermined values.

At STEP S13, the retrieval-condition designation section 11 designates a condition upon which a circuit path is retrieved. More specifically, it designates a retrieval condition for a first retrieval operation, and the retrieval conditions for retrieval operations after a second retrieval operation. The retrieval-condition designation section 11 designates a specific ranking of circuit paths as the retrieval condition for the first retrieval operation, where the ranking of the path is required to be higher than the specific ranking, when the paths are arranged in the decreasing order of, for example, signal-propagation/delay time. The retrieval-condition designation section 11 then designates retrieval conditions for retrieval operations subsequent to a second retrieval operation. As above, the interior of the integrated circuit is divided into regions, and a paths are determined according to their coverage of the integrated circuit.

Other conditions for the first retrieval operation include: the number of total steps (i.e., the sum of the numbers of cells on the paths), the total wiring length of the wiring for signal transmission on the path, the number of vias or of contacts on the path of a signal transmission line, and the layer to which wiring or the vias belong. Moreover, a coverage condition can be set in which the coverage is defined so that a path passes a divided region. The total number of steps and the total wiring lengths on the path, the number of vias and contacts, designation of a layer to which wiring or the vias belong, and the like in the divided region of an target can accordingly be considered as the coverage condition.

It should be noted that STEPs S11, S12 and S13 may be carried out in any order, or even simultaneously executed.

Subsequently, a path-list of circuit paths is generated at STEP S14. The path-list is generated by the path-list generation section 14 according to a timing analysis of the integrated circuit, and also based on the designated retrieval condition. The path list is stored in the path-list storage section 15.

It is determined at STEP SI5 whether the path list for the path of a target of the test pattern generation has been newly extracted. In the flow chart of FIG. 3 there is a loop in which the processing proceeds from STEP S13 to STEP S18, and then returns to STEP S13. Preferably, a retrieval condition is designated at a first cycle of the loop in such a way that a path-list of new paths is generated and the processing can proceed to STEP S16, based on the designation result.

At STEP S16, the path-list and circuit information are input to the test-vector generation section 16. Then, test vectors are generated for each path in the path-list. The circuit information to be input may be different in the degree of details and the level of the description form that of the circuit information used for generating path lists at STEP S14. The test-vector generation section 16 records and stores the test vectors in the test-vector storage section 17. Test-vector-generation information, indicating whether test vectors are successfully generated for each path, is recorded and stored in the test-vector-generation information storage section 18.

At STEP S17, the ending-condition judgment section 19 determines whether the generated test vectors collectively satisfy the requirements designated at STEP 12 for an ending condition.

At STEP S18, if the generated test vectors do not satisfy the established ending requirements, the processing returns to STEP S13. At STEP S13, a new retrieval condition is generated. More specifically, the previous retrieval condition can be modified to lead to the generation of a better test vector. A new path is then generated (STEP S14), based on the new retrieval condition. If necessary, a new path-list is also generated (STEP SI5), based on the new retrieval condition. When the path-list of new paths is generated, the processing proceeds to STEP S16. If a new path-list is not necessary, the processing proceeds to STEP S19. At STEP S19, final test-vector-generation information is output to an external memory. Moreover, a final test vector is output to the external memory at STEP S20. Thereafter, the test-vector generating method is ended. The processing may later return to STEP S13 again when the path-list of the new paths is not generated.

After STEP S18, the processing proceeds to STEP S19, at which a final test-vector-generation information is output to an external memory when the current test vectors satisfy the ending requirements. A final test vector is output to the external memory at STEP S20. That is, test-vector generation is ended when another path satisfying the retrieval condition is not newly retrieved, or when the test vectors collectively satisfy the ending condition.

In this manner, test-vector generation can be highly automated. Also, the quality of the generated test vectors can be improved in an automated fashion, because a test vector for a path can be generated by executing the test-vector generating method, using the retrieval condition and the ending condition. This allows test vectors to be constructed faster.

(Variant 1 of the First Embodiment)

Figure 4:
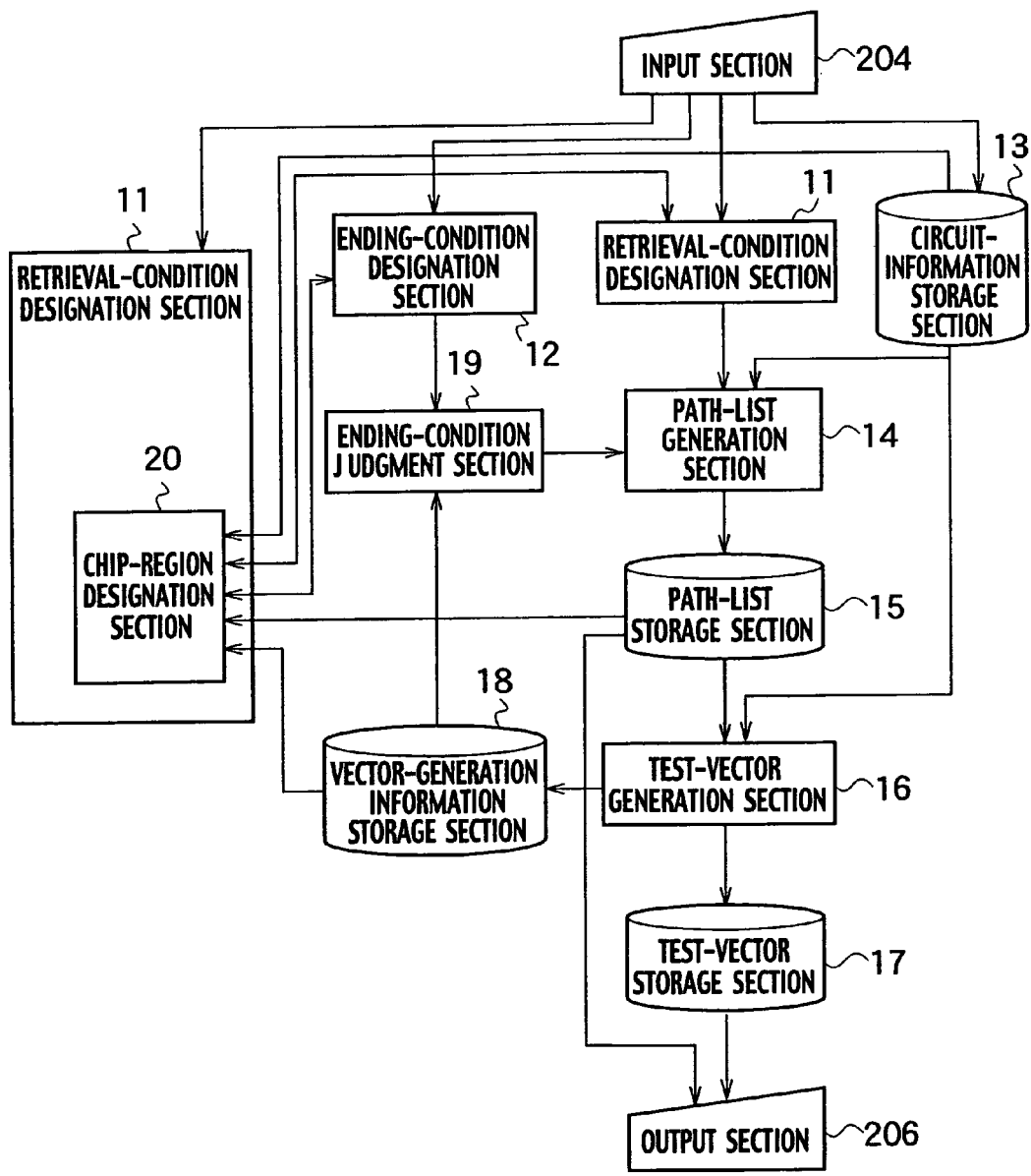
FIG. 4 is a block diagram of an apparatus for generating a test vector according to a variant 1 of the first embodiment.

In an apparatus of FIG. 2, a chip-region designation section 20 can be added to the ending-condition designation section 12, resulting in the apparatus of FIG. 4. The apparatus of FIG. 4 can function similar to the apparatus of FIG. 2, except that STEP S13 of the test-vector generating method (FIG. 3) can be expanded and changed as below.

The chip-region designation section 20 reads information on the logic of the integrated circuit from the circuit-information storage section 13. The chip-region designation section 20 generates a screen image of the entire chip area of the integrated circuit, or a portion of the logic circuit (typically, the so-called "user logic section" that excepts circuit blocks which are generally built-in). Then, the chip-region designation section 20 is configured to generate regions dividing the screen image of the logic circuit part, in preparation for forming test vectors. More specifically, in one embodiment, the section 20 designates a number of divisions in the vertical direction and in the horizontal one of the screen image of the logic circuit part, respectively, thus dividing the image into a number of equally-sized sections. To accomplish this, the chip-region designation section 20 generates display-image division information which has display positions for line segments for dividing the screen image of the logic circuit part on the screen image. The chip region specification part 20 divides the screen image of the logic circuit part by superposing line segments on the screen image, based on the display-image division information.

The chip-region designation section 20 displays the screen image of the divided circuit, where the line segments divide the circuit into regions. Using the display, an operator of the apparatus for generating a test vector can select a region. Preferably, a path corresponding to an already-generated test vector is already superposed on the screen image. By seeing a display screen on which the screen image of a path is superposed on the screen image of the integrated circuit, the operator can quickly discriminate between a divided region having a path for a test vector, and a region without. The operator can then select a region that not already covered by a path. In some embodiments, the operator is required only to select from those regions in which test vectors have not yet been generated. Preferably, selection occurs via a device such as an integral touch panel.

Retrieval-condition designation section 11 designates a retrieval condition upon which a path crossing the designated region can be retrieved. In the retrieval-condition designation section 11, a device user designates a region in which the user desires to arrange a path. The retrieval-condition designation section 11 then automatically generates a retrieval condition, requiring that the newly-created path travel through the designated region. By allowing generation of paths in user-selected regions of the integrated circuit, such paths can be more uniformly arranged on the integrated circuit.

As above, the user can designate a single region of the chip. However, one of ordinary skill in the art will realize that the chip-region designation section 20 can allow users to select a plurality of regions, as well as indicate a priority among the of regions. Paths arranged in each region can thus be retrieved in decreasing order of priority. Moreover, designation of regions in the chip-region designation section 20 may be performed whenever the processing returns to STEP S13, or after the loop in the flow chart of FIG. 3 is repeated a predetermined number of times. That is, operations in the chip-region designation section 20 can be assumed to be operations following designation of a retrieval condition at STEP S13, or they can be assumed to be operations included in operations at STEP S13.

Thus, the invention allows users to confirm the generation of test vectors at various stages. As above, users can confirm that they wish test vectors to be generated. After generation of test vectors, they can also designate other conditions such as a priority order. The invention thus allows for test vectors that are customized according to the needs of the device user. Moreover, as the operator designates a region in which the operator desires to form a test vector in a path, and at the same time repeatedly selects a new path while changing the retrieval condition which the apparatus for generating a test vector has designated, higher quality test vectors that more comprehensively test regions of the chip are produced.

(Variant 2 of the First Embodiment)

Figure 5:
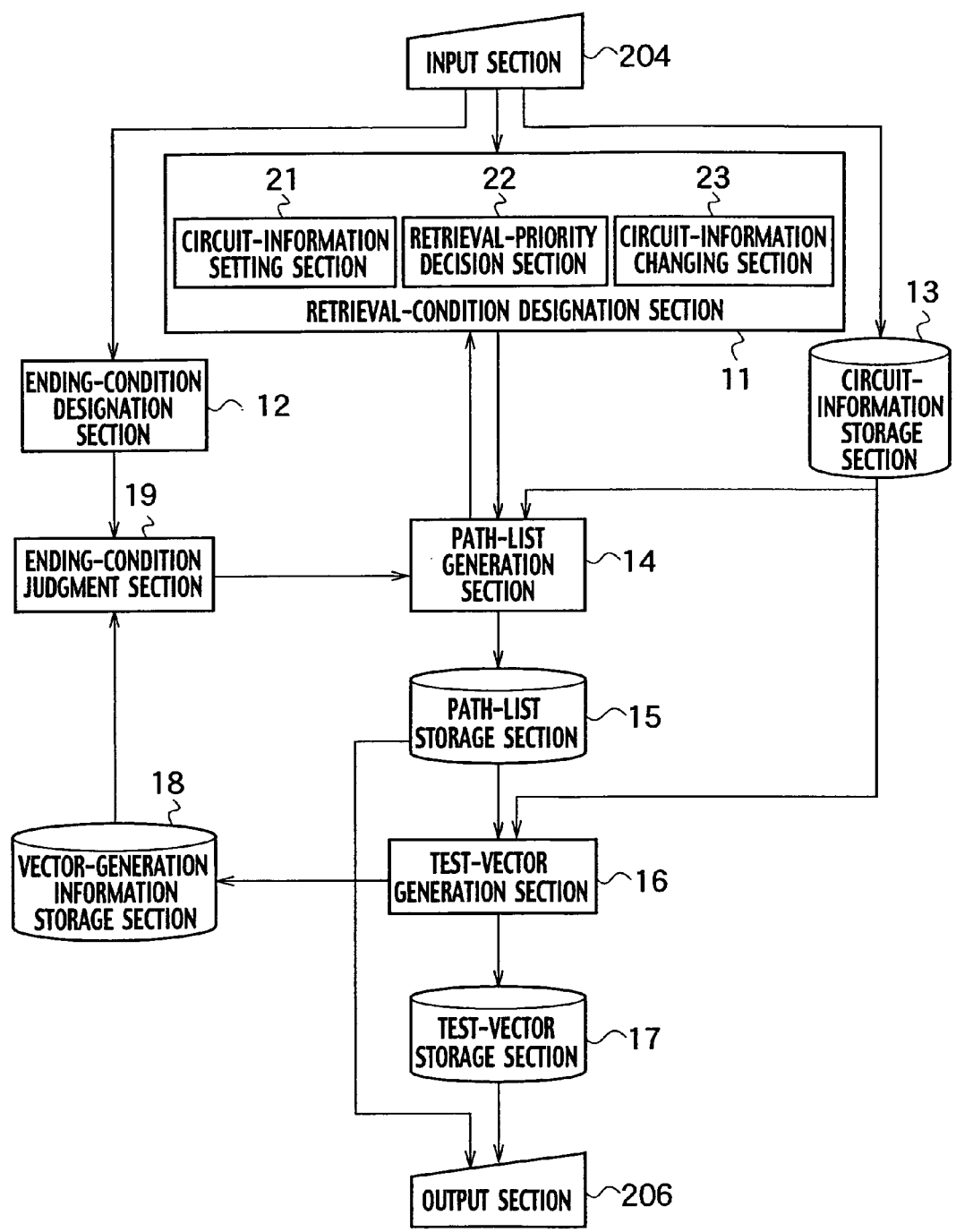
FIG. 5 is a block diagram of an apparatus for generating a test vector according to a variant 2 of the first embodiment.

An apparatus for generating a test vector according to a second variant of the first embodiment has a configuration as shown in FIG. 5. The apparatus of FIG. 5 is similar to that of FIG. 2, with one exception being that the retrieval-condition designation section 11 further includes a circuit-information setting section 21, a retrieval-priority decision section 22, and a circuit-information changing section 23.

The circuit-information setting section 21 further specifies portions of the retrieval condition. That is, for selected portions of the retrieval condition, the section 21 designates more specific information on the circuit path to be retrieved. For example, if it is desired to include a pin in the circuit path, the section 21 can identify a specific pin name as the start point or end point of the path. If a minimum path length is desired, the section 21 can specify a minimum wiring length, such as 2 mm or more. If a number of vias is desired, the section 21 can specify a minimum number of vias to be included along the path, such as 700 or more. Similarly, the section 21 can specify a minimum number of contacts instead of vias, or a minimum number of layers to be included. Similarly, the section 21 can set a minimum number of cells to be included, such as 20 or more. The section 21 can set any number of these criteria for a path, and can set as criteria any known benchmark by which a path can be designed.

The retrieval-priority decision section 22 decides a priority order for the various portions of the retrieval condition. Circuit paths are then retrieved according to this priority order. In the event that a circuit path fulfilling all the retrieval criteria cannot be retrieved (e.g., there is no circuit path that meets all the specified criteria), The circuit-information changing section 23 relaxes one or more of these criteria.

In summary, the retrieval condition includes: a circuit-information condition with criteria for a circuit path to be retrieved; a retrieval-priority condition prioritizing these criteria; and a circuit-information changing condition that relaxes the criteria if no circuit path meets them all. The circuit-information setting section 21 specifies further details of the criteria, such as ranges of various values that the path must meet. The retrieval-priority condition is set by the retrieval-priority decision section 22, and the circuit-information changing section 23 provides the circuit-information changing condition, relaxing the criteria as necessary.

One of ordinary skill in the art will observe that the sections 21, 22, 23 allow for the revising and/or updating of retrieval conditions in a dynamic manner. For example, a large number of items are adopted as a first retrieval condition, and items can be later deleted to form subsequent retrieval conditions. Moreover, a target value with which a path is not easily extracted can be adopted as part of the first retrieval condition, relaxed as necessary in subsequent retrieval conditions, so as to make path retrieval easier. One of ordinary skill in the art will also realize that the retrieval-condition designation section 11 can be provided with any or all of the circuit-information setting section 21, the retrieval-priority decision section 22, and the circuit-information changing section 23.

Figure 6:
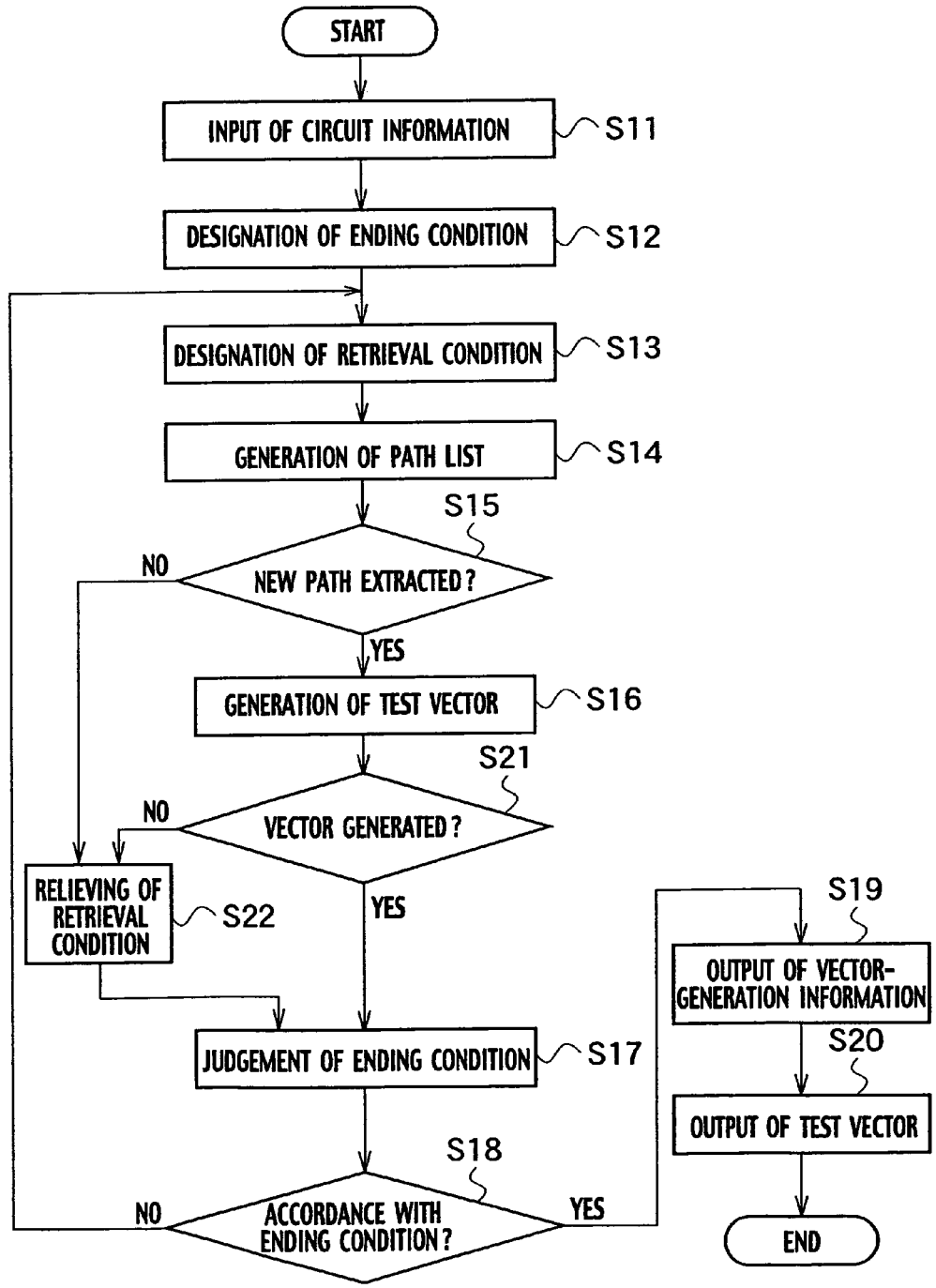
FIG. 6 is a flow chart of a test-vector generating method according to the variant 2 of the first embodiment.

FIG. 6 illustrates a test-vector generating method according to the second variant of the first embodiment. This method is obtained by adding STEPs S21 and S22 to the test-vector generating method of FIG. 3. The relaxing of a retrieval condition is performed at STEP S22 in the test-vector generating method after it is determined that no path satisfies the stricter retrieval condition.

When it is decided that extraction of a new path has failed (STEP S115), the processing proceeds to STEP S22 and the path-list generation section 14 sets a failed-retrieval flag in the path-list storage section 15. Similarly, when it is decided that generation of a new test vector has failed (STEP S21), the processing proceeds to STEP S22 and the test-vector generation section 16 sets a failed-retrieval flag in the test-vector storage section 17. The circuit-information changing section 23 then detects the failed-retrieval flag for relieving the retrieval condition (STEP S22). In this manner, new paths can be repeatably selected, allowing users to iteratively improve the quality of their test vectors.

(Variant 3 of the First Embodiment)

Figure 7:
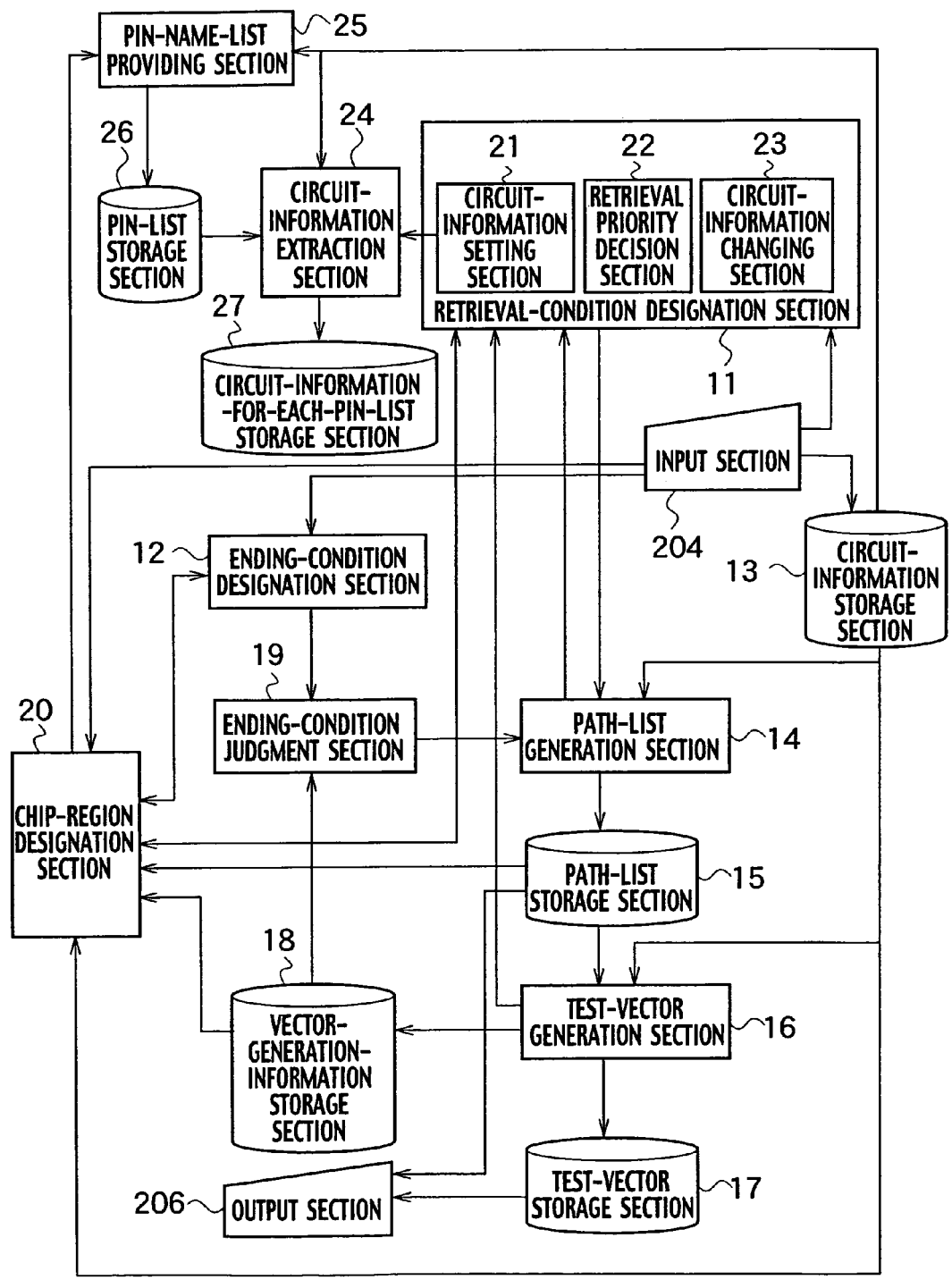
FIG. 7 is a block diagram of an apparatus for generating a test vector according to a variant 3 of the first embodiment.

FIG. 7 illustrates an apparatus for generating a test vector according to a third variant of the first embodiment. The third variant is similar to FIG. 5 but further includes: a chip-region designation section 20; a pin-name-list providing section 25; a pin-list storage section 26; a circuit-information extraction section 24; and a circuit-information for each pin-list storage section 27.

The pin-name-list providing section 25 compiles a list of pins corresponding to cells in the designated regions. This list can be compiled from chip layout information. In the circuit-information extraction section 24, circuit information according to the retrieval item is extracted for each pin-name list.

A flow chart summarizing variant 3 is largely the same as that of FIG. 6. In the chip-region designation section 20, a region in the chip is designated. The pin-name list is made in the pin-name-list providing section 25, using region information on the designated region and circuit information stored in the circuit-information storage section 13. The compiled pin-name list is stored in the pin-list storage section 26. In the path-list generation section 14, timing analysis is executed, based on the circuit information according to the pin-name list for each retrieval item, and a path covering the designated region is retrieved.

Based on data of circuit information in the circuit-information storage section 13, the circuit-information extraction section 24 extracts circuit information with regard to an item, which is set in the circuit-information setting section 21, in each pin-name list which is stored in the pin-list storage section 26. Here, the circuit information for each pin-name list is, for example, a wiring length of each wiring which is connected to each pin corresponding to each pin name described for each pin-name list. Moreover, the circuit information in each pin-name list is information such as the names of the wiring layers for each wiring which is connected to each pin listed. The extracted circuit information is stored in the circuit-information for each pin-list storage section 27.

Thus, the retrieval-condition designation section 11 and an operator can adjust the quality of the test vector which is finally generated in order to obtain a higher quality test vector, because information such as a pin-name list for a selected region, a wiring length and a wiring layer corresponding the pin-name list can be automatically obtained when the chip-region designation section 20 selects a region. According to this method, a retrieval condition of a path may be designated so as to include the pin to which the longest length of wiring is connected.

(Variant 4 of the First Embodiment)

Figure 8:
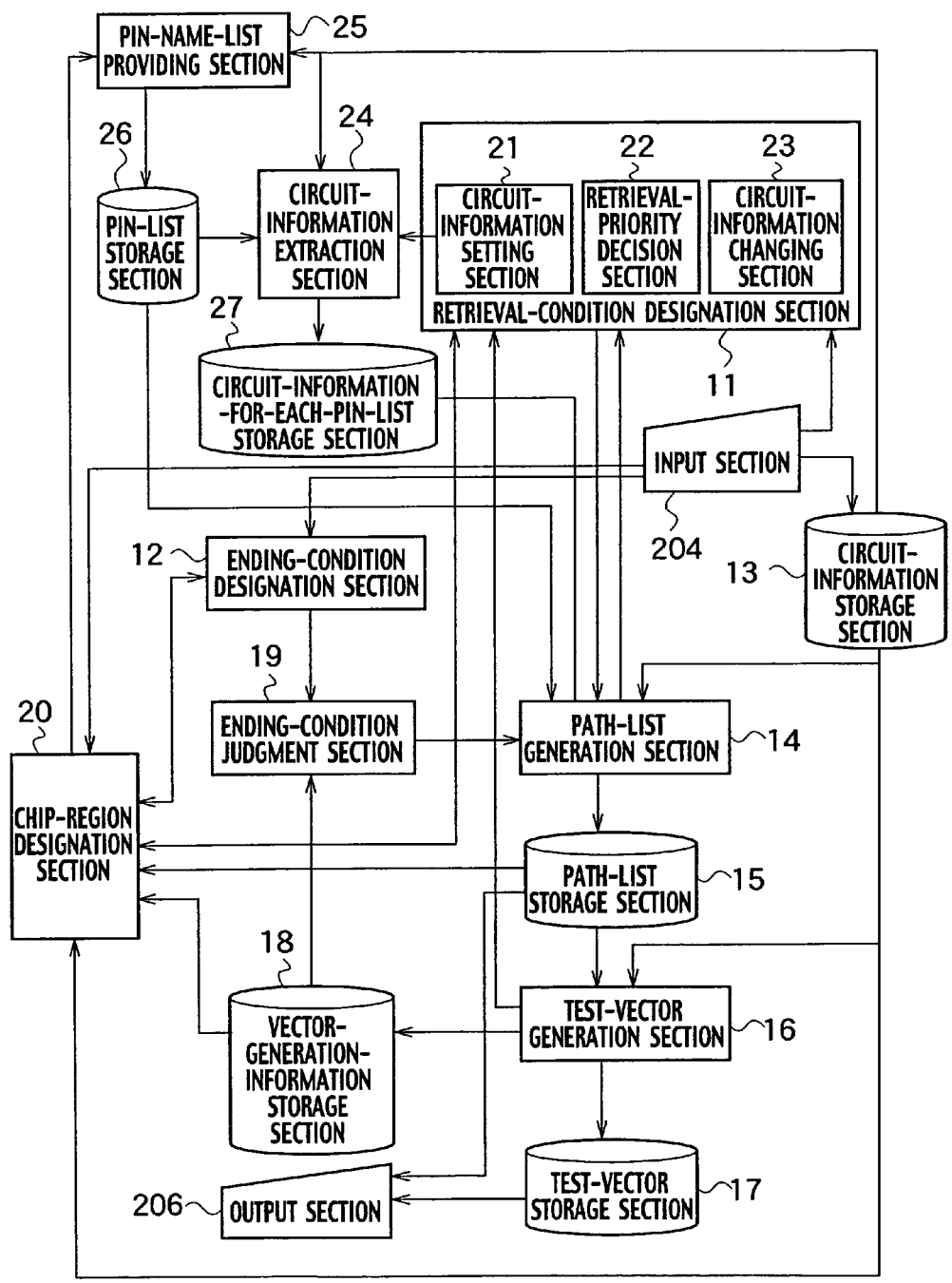
FIG. 8 is a block diagram of an apparatus for generating a test vector according to a variant 4 of the first embodiment.

FIG. 8 illustrates an apparatus for generating a test vector according to a fourth variant of the first embodiment. Here, a list of pins (from section 26) and their associated circuit information (from section 27) are further input to a path-list generation section 14 like that shown in FIG. 7.

The chip-region designation section 20 designates a region in the chip. The pin-name-list providing section 25 makes a pin-name list for the designated region. The compiled pin-name list is stored in the pin-list storage section 26. In the circuit-information extraction section 24, circuit information for the retrieval condition is extracted for each pin-name list, based on the pin-name list, the circuit information and the retrieval condition and circuit information for each pin list is generated. The generated circuit information for each pin list is stored in the circuit-information for each pin-list storage section 27.

Based on the pin-name list stored in section 26 and corresponding circuit information stored in section 27, the path-list generation section 14 makes a path list for new paths. The path-list generation section 14 is not required to make a path list by reading required circuit information from the vast amount of circuit information recorded in the circuit-information storage section 13. The amount of circuit information required for each pin list is far smaller than that stored in the circuit-information storage section 13. Moreover, the amount of information can be greatly reduced because the circuit information is stored with regard to only the pin-name list.

When new circuit paths cannot be generated, a new path-list also cannot be created, and the path-list generation section 14 sets a failed extraction flag. The circuit-information changing section 23 detects the failed-extraction flag to relax the retrieval condition. The path-list generation section 14 makes a path-list of new paths, based on the relieved retrieval condition, and extraction of a new path is continued.

Paths which pass through a region designated by the chip-region designation section 20 are added to the compiled path-list. The test-vector generation section 16 generates a test vector for the path list. The region designated by the test vector can then be tested. When the test-vector generation section 16 fails to generate a test vector, the circuit-information changing section 23 relaxes the retrieval condition. The test-vector generation section 16 then attempts to generate a test vector again. Note that the retrieval condition is relaxed only when a new path cannot be extracted, or a new test vector cannot be generated. In this manner, a new path can be repeatedly retrieved while changing the retrieval condition for a path list in the designated region, and a new test vector can be repeatedly formed while changing the generation condition of test vectors for the extracted path. This allows for iterative improvement in the test vector, resulting in better IC tests. The ability of the user to select the region in which paths must pass further improves the quality of the test vectors.

(Variant 5 of the First Embodiment)

Figure 9:
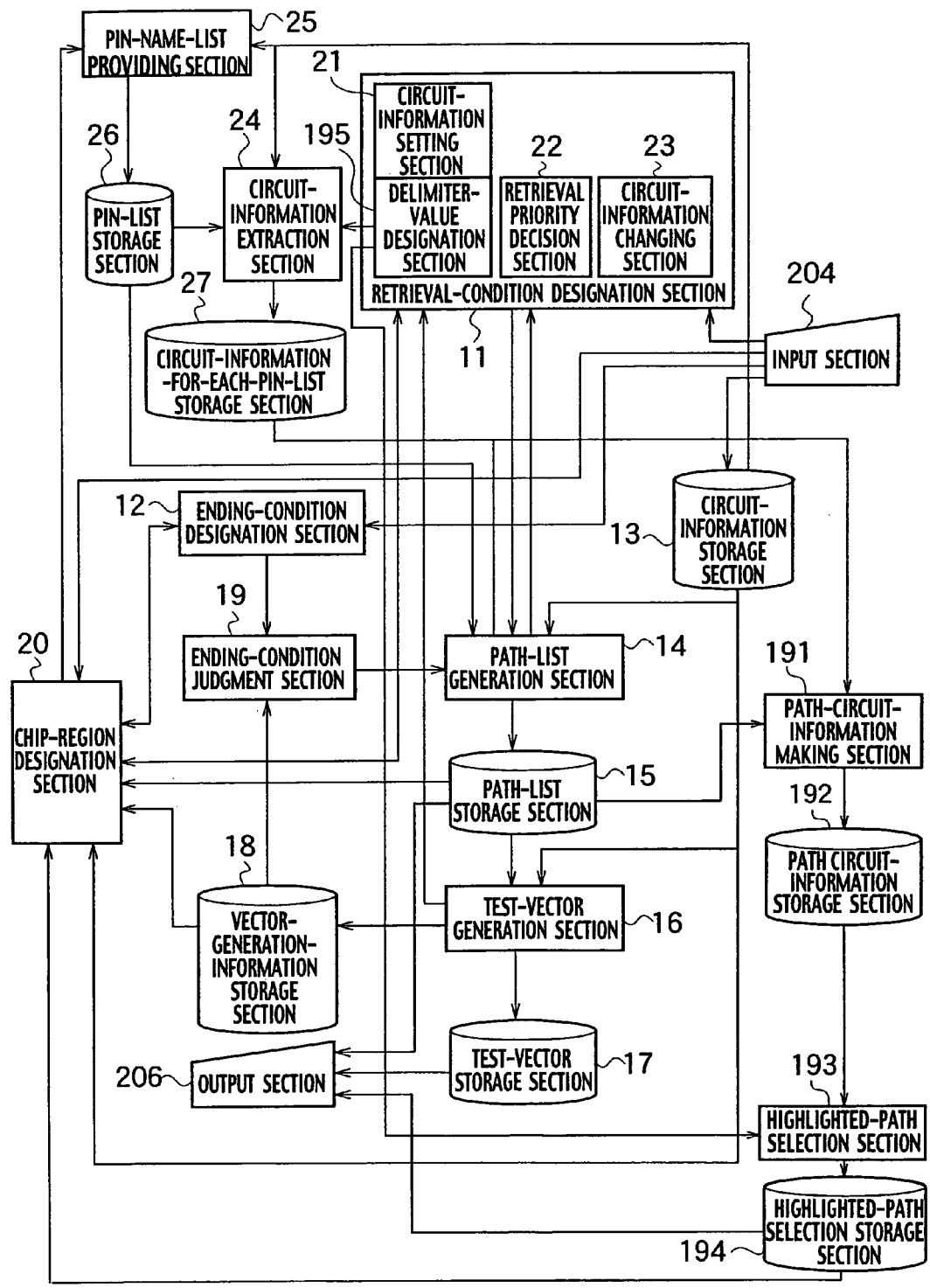
FIG. 9 is a block diagram of an apparatus for generating a test vector according to a variant 5 of the first embodiment.

FIG. 9 illustrates an apparatus for generating a test vector according to a fifth variant of the first embodiment. The apparatus is similar to that of FIG. 8, but further includes: a path-circuit-information making section 191; a path-circuit-information storage section 192; a highlighted-path selection section 193; a highlighted-path information storage section 194; and a delimiter-value designation section 195.

The path-circuit-information making section 191 generates circuit information for portions of the retrieval condition. The circuit information is extracted by the circuit-information extraction section 24 for each pin list of the retrieval condition.

The delimiter-value designation section 195 sets a delimiter that serves to indicate preferences for ranges of the retrieval items. For example, the delimiter can set multiple ranges for a retrieval item, and these ranges can be prioritized so that the methods of the invention first seek to retrieve a circuit path falling within higher-priority ranges. The delimiter can also act as a minimum that the retrieved path should exceed. Here, the delimiter-value designation section 195 is preferably provided by the retrieval-condition designation section 11, because the delimiter value is set with regard to portions of the retrieval condition.

The highlighted-path selection section 193 compares the circuit information on paths according to each retrieval item with the delimiter value. The paths are distinguishably displayed and are superposed on a screen image of the IC for each zone, which is divided by the delimiter value, and to which the circuit information on paths belongs, according to each retrieval item.

The path-list generation section 14 generates a path-list. The generated path-list is stored in the path-list storage section 15. The circuit information for paths in the path list is generated or compiled in the circuit-information making section 191, and stored in the path-circuit-information storage section 192.

When the delimiter value establishes a minimum criterion that paths should meet, the highlighted-path selection section 193 selects paths that meet or exceed the delimiter value. The more by which the delimiter value is exceeded, the stronger the tendency to extract the path. Accordingly, exceeding the set delimiter value is a standard for extracting the path. The highlighted-path selection section 193 makes a list of paths for which the screen images are superposed on the screen image of the IC while highlighting the screen images of the paths. The list of highlighted paths is stored in the highlighted-path information storage section 194. The chip-region designation section 20 superposes these highlighted paths on a screen image of the IC.

In the above-described test-vector generating method, the chip-region designation section 20 can select a region of the IC, the delimiter-value designation section 195 sets a delimiter value for determining whether a path should be highlighted, the highlighted-path selection section 193 selects a path to be highlighted based on the delimiter value, and the chip-region designation section 20 highlights the selected path. In this manner, an operator can easily confirm whether a highlighted path is arranged in a selected region, and can repeat the process with different retrieval conditions if not. This can yield more effective test vectors.

Second Embodiment

A fault analysis apparatus of an IC according to the second embodiment executes operations corresponding to STEPs S6 through S8 in FIG. 1. In the fault analysis apparatus, a fail path is identified, and lists are made of the cells and pins that the fault path intersects. The fault analysis apparatus generates a list of paths that intersect this fault path. Furthermore, the fault analysis apparatus generates a test vector for this path list, for further testing. It is decided that a fault is caused on the common part of the fail path when a further path fails in the testing. As described above, a fault point can be located by repeatedly generating different test vectors for different paths that each intersect different parts of the fail path. The retrieval conditions for these paths can be determined as in the first embodiment above. In this manner, the invention yields highly automated test-vector generation that also improves the quality of the test vectors employed.

Figure 10:
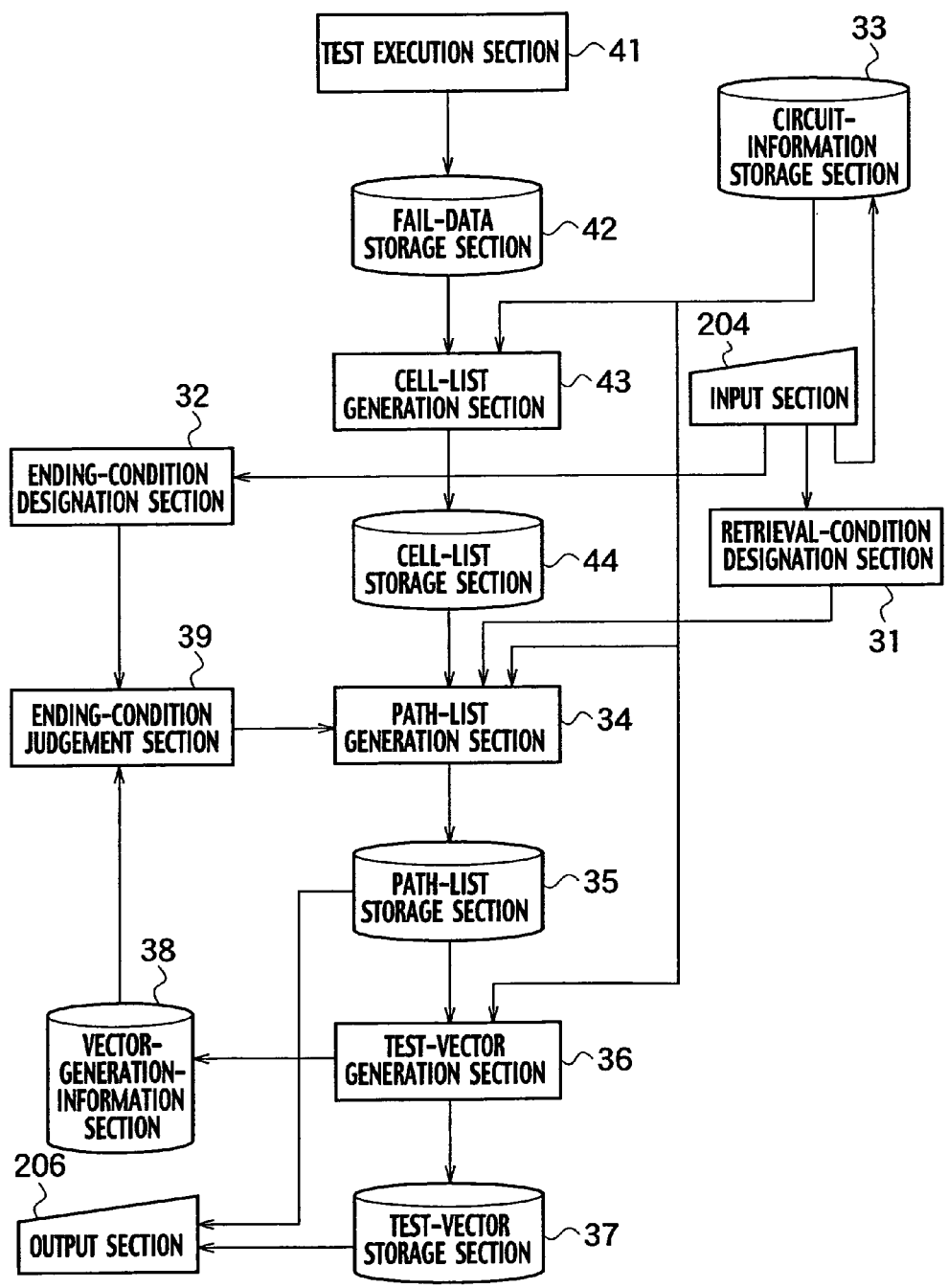
FIG. 10 is a block diagram of a fault analysis apparatus of a semiconductor circuit according to a second embodiment.

FIG. 10 illustrates a fault analysis apparatus of an IC according to the second embodiment. The apparatus includes: a test execution section 41; a fail-data storage section 42; a cell-list generation section 43; a cell-list storage section 44; a path-list generation section 34; a path-list storage section 35; test-vector generation section 36; test-vector storage section 37; a retrieval-condition designation section 31; an ending-condition designation section 32; a circuit-information storage section 33; an ending-condition judgment section 39; a vector-generation-information storage section 38; an input section 204; and an output section 206.

The test execution section 41 tests for delay faults in the IC. A test vector 1 in FIG. 1 can be used in the test. The test vector 1 is stored in a test-vector storage section 17 in FIG. 2. The fail-data storage section 42 stores a result for a delay fault test. In particular, a distinguishable display number of a fail path, on which a delay fault is caused, is stored.

The cell-list generation section 43 generates a list of those cells forming the fail path, based on the result of a delay fault test and the IC layout information stored in the circuit-information storage section 33. The list of cells is then stored in the cell-list storage section 44.

The retrieval-condition designation section 31 designates a retrieval condition for retrieving paths that intersect parts of the fail path. The path-list generation section 34 then retrieves paths based on the designated retrieval condition, and generates a path list for fault-cell searching, wherein cells forming the retrieved paths are arranged in the order by which a signal can be transmitted. The path-list storage section 35 stores the generated path list.

The test-vector generation section 36 generates a test vector for fault-cell searching, based on the circuit information in the circuit-information storage section 33, for each path in the path list. The test-vector storage section 37 stores this test vector. The vector-generation-information storage section 38 stores a generation state of the test vector as vector-generation information.

The ending-condition designation section 32 designates an ending condition which ends the generation of the test vector. Here, the ending condition to be designated may be of a fixed type or of a variable type. The ending-condition judgment section 39 stops generation of the path-list when the vector-generation information satisfies the ending condition. The input section 204 and the output section 206 exchange data between the fault analysis apparatus of the IC, and the external apparatus or the operator.

(Fault Analysis Method for an IC)

Figure 11:
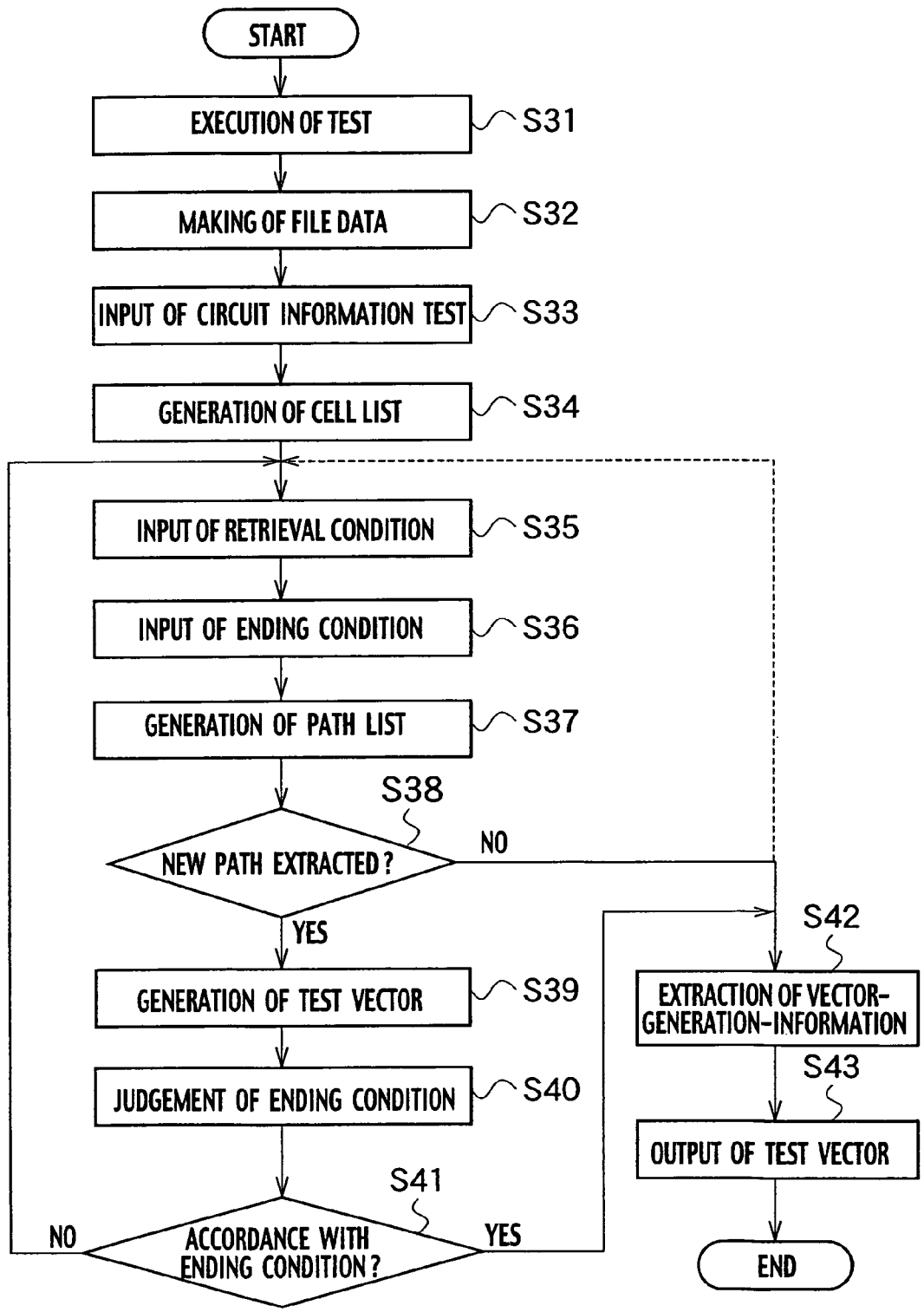
FIG. 11 is a flow chart of a fault analysis method of a semiconductor circuit according to the second embodiment.

FIG. 11 illustrates a fault analysis method of an IC according to the second embodiment. Here, delay fault testing of the IC is executed by the test execution section 41 (STEP S31, which corresponds generally to STEP S6 of FIG. 1). A specific path is activated by a test vector. It is then determined whether the fault analysis is required or not, depending on the presence of a fail path in the test (STEP S7). If no fail path is generated, the processing proceeds to STEP S9, and processing of the IC is stopped. If a fail path is generated, the processing proceeds to STEP S8, which in this embodiment includes STEPS S32 through S43 in FIG. 11.

When a fail path is generated, the test execution section 41 compiles fail data including a distinguishable display number of the fail path (STEP S32). The fail-data storage section 42 stores the fail data, which can include results such as, for each path, test numbers, measured delay times, and the like.

Then, circuit information is transmitted from the circuit-information storage section 33 to the cell-list generation section 43 (STEP S33). This circuit information may be a netlist describing the connections between cells, or layout information when the retrieval condition requires more details of the placing and routing of the cells. The cell-list generation section 43 then generates a cell list of cells forming the fail path, based on the fail data and the circuit information (STEP S34). The generated cell list is stored in the cell-list storage section 44.

The retrieval-condition designation section 31 designates a retrieval condition designed for retrieving a path that intersects part of the fail path (STEP S35). The total number of steps and the total wiring lengths on the path, the number of contacts and vias, designation of a layer to which wiring and the vias belong, and the like can be listed as a retrieval condition for fault-cell searching in a similar manner to that of STEP S13 in FIG. 3. Preferably, the retrieval range corresponding to the retrieval item is different from that of STEP S113. Moreover, as part of the retrieval condition, operators are allowed to designate an amount of the retrieved path that is to overlap with the fail path.

At STEP S36, the ending-condition designation section 32 designates the ending condition for fault-cell searching to end generation of a test vector. Similar to STEP S12, the ending condition can be a threshold number of test vectors successfully generated, whether a test vector has been successfully generated for each path to be tested, or the like. By generating test vectors that share portions of the fail path, the location of the fault point can be narrowed down. The ending condition can be designated so as to simply narrow down the locations where the fault point can be, or it can be set so as to find the precise location of the fault point. Also, it should be noted that STEPs S35, S36 or any of the STEPs above can be executed in any order.

At STEP S37, the path-list generation section 34 extracts the cells of the fail path, and generates a list of paths that satisfy the retrieval condition for those cells. A check is then made as to whether a path satisfying the retrieval condition for fault-cell searching has been extracted (STEP S38). If so, the processing proceeds to STEP S39. If not, the processing returns to STEP S35 and the retrieval condition is adjusted again. After a satisfactory path has been retrieved and a corresponding test vector has been generated (i.e., by STEPs S35 through STEP S41), processing proceeds to STEP S42.

The path-list for fault-cell searching, and the circuit information on the IC stored in the circuit-information storage section 33, are input to the test-vector generation section 36 (STEP S39) which then generates a test vector for fault-cell searching. This test vector can detect a delay fault in each path included in the path-list. The circuit information may have a detail level and description format different from that of the circuit information used in generate the path-list at STEP S37. When the test vector is successfully generated for fault-cell searching, the test-vector generation section 36 stores the test vector in the test-vector storage section 37. Moreover, whether the test vector is successfully generated or not, the section 36 stores a distinguishable display number of a path in the vector-generation-information storage section 38.

The ending-condition judgment section 39 judges at STEP S40 whether the vector-generation information satisfies the ending condition for fault-cell searching. When the ending-condition judgment section 39 decides that the vector-generation information satisfies the ending condition for fault-cell searching (STEP S41), the processing proceeds to STEP S42 to stop generation of the test vector. However, if the ending-condition judgment section 39 decides that the ending condition is not satisfied, processing returns to STEP S35. The retrieval-condition designation section 31 updates the retrieval condition to a new condition for fault-cell searching. A new path for fault-cell searching, satisfying this updated retrieval condition, is retrieved and a path-list and a test vector for fault-cell searching are generated (STEPs S35 to STEP S41). The loop is ended when a new path in accordance with the retrieval condition for fault-cell searching is not retrieved, or when the vector-generation information is in accordance with the ending condition, and the processing proceeds to STEP S42. At STEP S42, the test-vector generation section 36 extracts a final vector-generation information and outputs the final vector-generation information to the external memory. At STEP S43, the test-vector generation section 36 outputs the generated test vector to the external memory.

In this manner, a method of generating a test-vector for analysis of a delay fault path can be highly automated and the quality of a generated test vector for fault-cell searching can be improved. Moreover, the time required for fault analysis can be reduced from the traditional period of several weeks through several months, down to a period of several days through several weeks.

(Variant 1 of the Second Embodiment)

Figure 12:
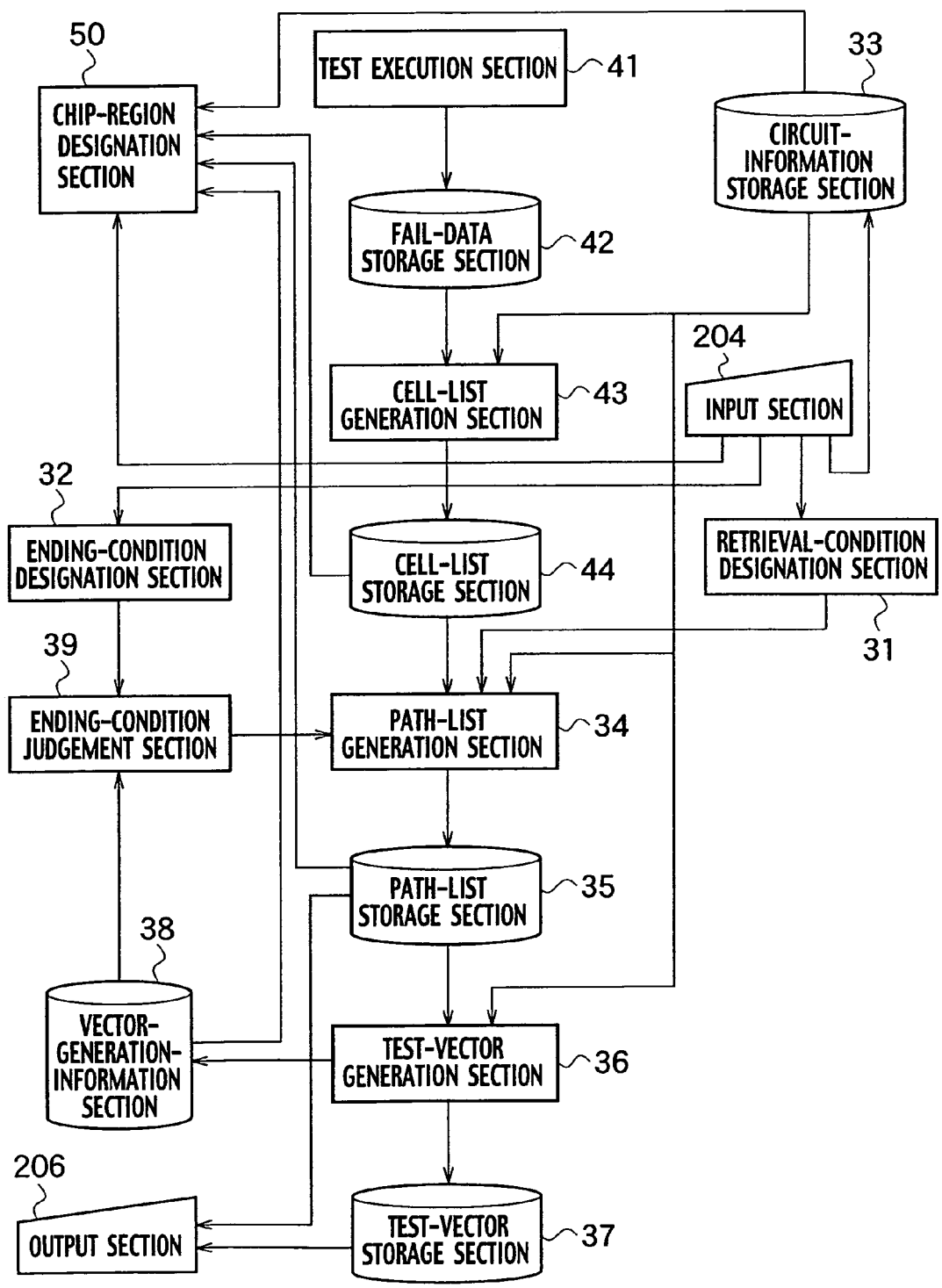
FIG. 12 is a block diagram of a fault analysis apparatus of a semiconductor circuit according to a variant 1 of the second embodiment.

As shown in FIG. 12, a fault analysis apparatus of an IC according to a first variant of the second embodiment is similar to that of FIG. 10, but further including a chip-region designation section 50. The chip-region designation section 50 highlights the fail path on the screen image of the IC, in any appropriate manner. In other regards, the method of this embodiment is largely similar to that of FIG. 11. The chip-region designation section 50 also reads the placing and routing of layout information of the IC from the circuit-information storage section 33 and displays the appropriate region of the IC at STEP S40. Then, the cell list of the fail path from the cell-list storage section 44, the list of paths newly retrieved from the path-list storage section 35 and the vector-generation information from the vector-generation information storage section 38 are input to the chip-region designation section 50. Then, images of the fail path and a path for which a new test vector is generated are displayed on the image of the chip region.

The chip-region designation section 50 also allows users to update the retrieval condition themselves. More specifically, when insufficient information exists to conduct a fault analysis, the section 50 queries the user to determine whether he or she wishes to update the retrieval condition. If so, the section 50 allows the user to enter retrieval condition information, which is sent to the retrieval-condition designation section 31. The retrieval-condition designation section 31 updates the retrieval condition accordingly, and a corresponding new test vector is then generated.

The chip-region designation section 50 checks the degree of overlap of the fail path with the path for which a new test vector is generated, using an image display. The chip-region designation section 50 then requests the retrieval-condition designation section 31 to update the retrieval condition to cover portions of the fail path not yet covered by the new test vector.

(Variant 2 of the Second Embodiment)

Figure 13:
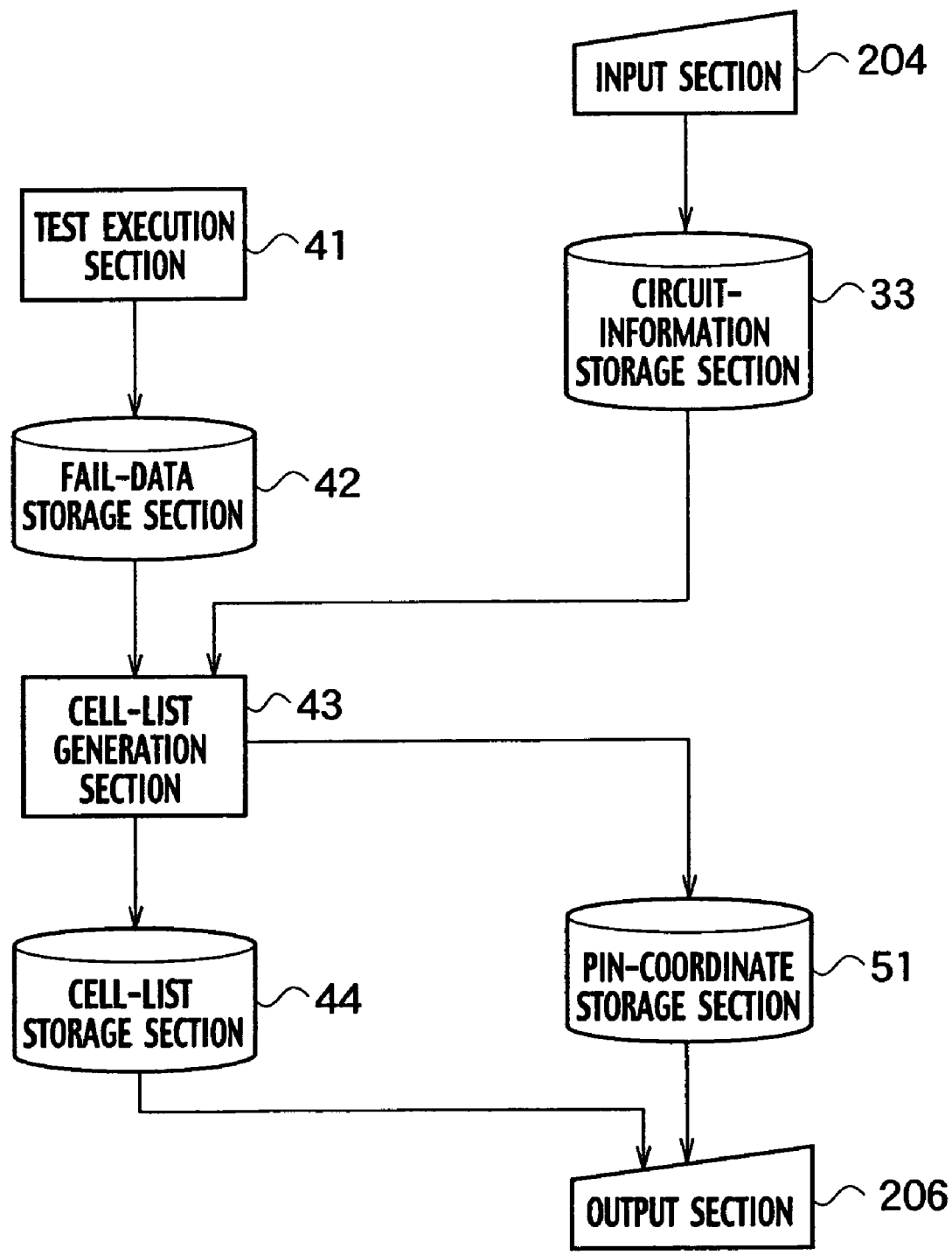
FIG. 13 is a block diagram of a fault analysis apparatus of a semiconductor circuit according to a variant 2 of the second embodiment.

As shown in FIG. 13, a fault analysis apparatus of an IC according to a second variant of the second embodiment is similar to that shown in FIG. 10, but further includes a pin-coordinate storage section 51. Only parts related with the addition of the pin-coordinate storage section 51 are shown in FIG. 13.

In the cell-list generation section 43, IC layout information is read from the circuit-information storage section 33 and pin-coordinate information is generated, based on the layout information. The pin-coordinate storage section 51 stores the pin-coordinate information, which includes pin names and their x-coordinate and a y-coordinate. The pin-coordinate storage section 51 also includes a data region which can memorize the pin name and another data region which can memorize x- and y-coordinates of the pin.

This embodiment can be employed in connection with tests such as those by which electron beams are irradiated on a chip. In this test method, the pin-coordinate information of the input/output pin of the cell is useful in locating the pins for irradiation. According to the above test method, the pin-coordinate information is automatically generated as fail-path information to reduce time required for fault analysis.

(Variant 3 of the Second Embodiment)

Figure 14:
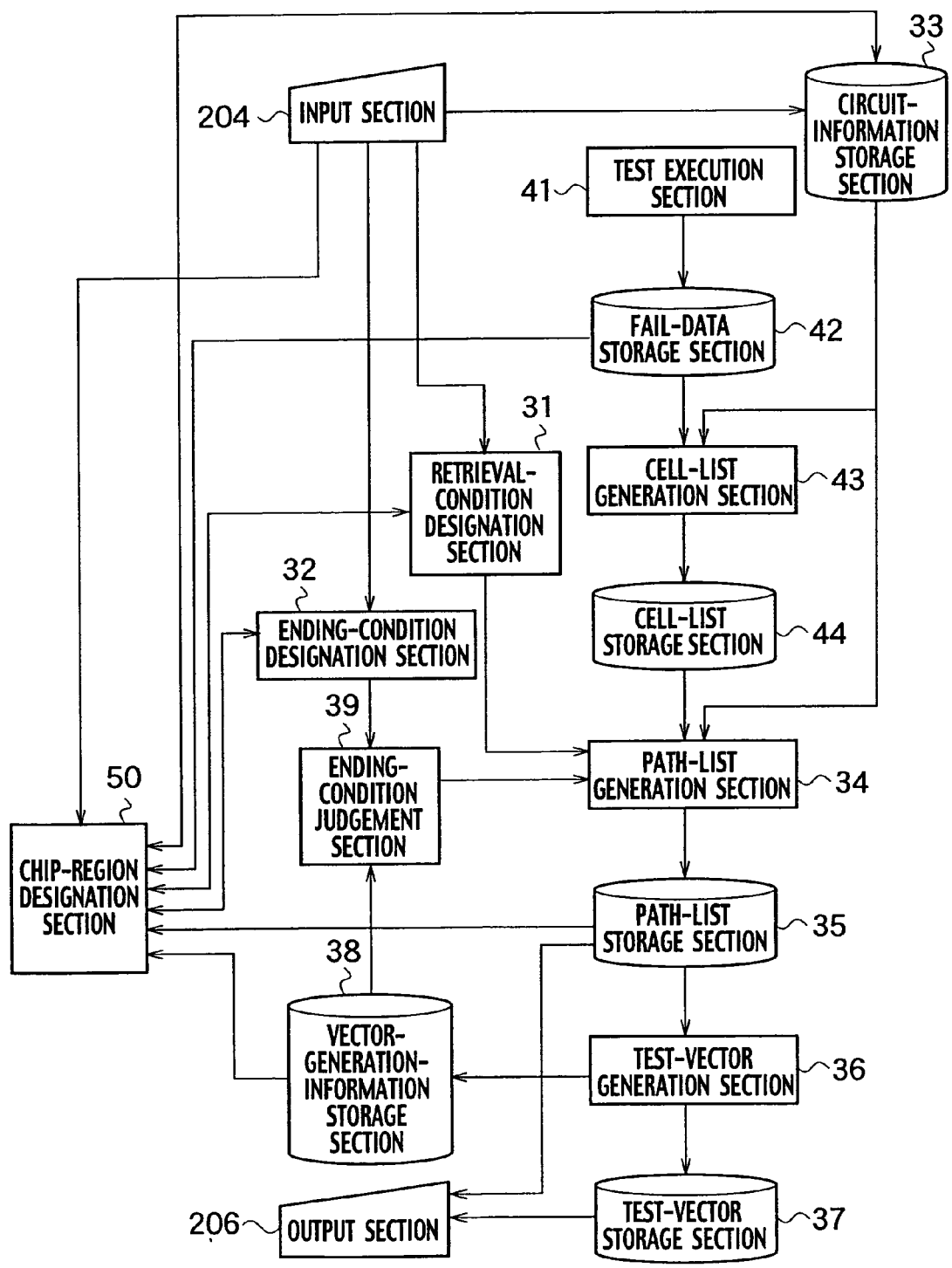
FIG. 14 is a block diagram of a fault analysis apparatus of a semiconductor circuit according to a variant 3 of the second embodiment.

FIG. 14 illustrates a fault analysis apparatus of an IC according to a third variant of the second embodiment. This apparatus is similar to that of FIG. 12 except that fail data from a fail-data storage section 42 is further input to a chip-region designation section 50. A retrieval condition and the like are output from the chip-region designation section 50 to a retrieval-condition designation section 31 and an ending condition and the like are output to an ending-condition designation section 32. On the other hand, a cell list is not output from a cell-list storage section 44 to the chip-region designation section 50.

The chip-region designation section 50 reads circuit information from a circuit-information storage section 33, and displays an image of that circuitry. The section 50 also divides the image into sections in any known manner, such as by dividing the image into equal portions, or by allowing users to divide the image.

A successful path, i.e., a no fail path, and fail data on a fail path are input from the fail-data storage section 42 to the chip-region designation section 50, so that images of the successful path and a physical position of the fail path on the chip can be displayed. The fail path and the successful path are displayed so that both paths can be distinguished from each other. By display of the successful and fail paths, an operator can confirm a ratio between the successful paths and the fail paths in each region and a distribution bias between the successful paths and the fail paths.

The chip-region designation section 50 sets a coverage condition for the fail paths, i.e. the amount of the fail path covered by the retrieved paths. A condition that a number of fail paths passing a region is equal to or larger than a predetermined value can be applied for a coverage condition for the fail paths.

The retrieval-condition designation section 31 designates regions of the fail path that are to be covered by the newly-generated paths. Alternatively, the chip-region designation section 50 can query users to input regions to be covered by the newly-generated paths. The chip-region designation section 50 outputs the operator input region to the retrieval-condition designation section 31, which incorporates this into the retrieval condition.

Based on the new retrieval conditions, the path-list generation section 34 retrieves circuit paths for fault-cell searching and generates a path-list of the path. The test-vector generation section 36 generates a test vector for the generated path-list, and outputs vector-generation information to the vector-generation information storage section 38 for storage when the test vector is successfully generated. The chip-region designation section 50 also displays the image of the new path for fault-cell search, based on the vector-generation information.

The chip-region designation section 50 can designate not only a retrieval condition for designating a region, but also priorities for generation of a path list as a retrieval condition. Furthermore, it can designate priorities for generation of a test vector as a retrieval condition. Furthermore, the designation of a region by the chip-region designation section 50 may be performed at STEP S35 and S36 in the loop after a test vector is generated at STEP S40 in FIG. 11 for every loop or every predetermined number of loops.

Thus, successful paths, failed paths, or situations of test-vector generation during generation of paths for fault-cell searching can all be displayed. The following priorities in the retrieval condition for path lists and in the ending condition for test vectors can be automatically designated by an operator, based on the above display.

EXAMPLES

Example 1 of the First Embodiment

In a test-vector generating method according to an example 1 of the first embodiment, circuit information is input from the circuit-information storage section 13 to the path-list generation section 14 as shown in STEP S11 of FIG. 3.

Then, an ending condition shown in FIG. 16 is generated in the ending-condition designation section 12 at STEP S12. The ending condition has an ending-condition-item data region 54 and an end-condition-range data region 55. The end-condition-item data region 54 contain items that act as criteria for the test vector. The end-condition-range data region 55 gives acceptable ranges for these items. FIG. 16 illustrates one example, where at least 20 test vectors must be generated, and they must pass at least 200 gates. FIG. 15 illustrates another example, in which conditions are set for each test vector. Here, each vector must have 10 steps or more, must pass 300 gates or more, and must cross at least 1000 vias. The invention includes the use of conditions for each test vector, conditions for the collective set of vectors, and any criteria that can serve as a condition for either.

Then, a path-list of paths as shown in FIG. 17 is generated in the path-list generation section 14 (i.e., STEP S14). The exemplary path-list has a path-list data region 56 so that a computer can write and read data. The path-list data region 56 has a distinguishable display number of path 1 for a path as leading-line data: Path 1-1. The path-list data region 56 has a distinguishable display number of GFD1 EX2 for a cell as a cell-line data: Cell 1-1. The path-list data region 56 has a distinguishable display number of (GNR2X1) for a cell as cell-line data: Cell 1-2. The cell-line data: Cell 1-2 is arranged below the cell-line data: Cell 1-1. Similarly, the path-list data region 56 has a distinguishable display number of (GIVX1) for a cell as cell-line data: Cell 1-3. The cell-line data: Cell 1-3 is arranged below the cell-line data: Cell 1-2. Similarly, the path-list data region 56 has distinguishable display numbers for cells as cell-line data: Cell 1-4 through 1-19. The distinguishable displays as cell-line data: Cell 1-4 through 1-19 are sequentially arranged from the Cell 1-4. In the configuration of the path-list data region 56, nineteen steps of the Cell 1-1 through Cell 1-19 are sequentially connected to each other in an ascending order from the Cell 1-1 to form the path of path 1. The above nineteen steps satisfy the retrieval condition that the total number of steps for the path in FIG. 15 be ten steps or more.

It is judged at STEP S15 whether a new path-list of paths is extracted. Since the path-list for a new path of path 1 has been generated, the processing proceeds to STEP S16. At STEP S16, the test-vector generation section 16 generates test vectors and information as to whether the test vectors were successfully generated. An example of such information is compiled in FIG. 18. In FIG. 18, the compiled information is broken down into an item data region 57 and a situation data region 58. The item data region 57 includes as exemplary item data: a number of input paths; a number of generated test vectors; numbers of paths which have succeeded in generation of test vectors; numbers of paths which have failed in generation of test vectors; and names of the test vectors. The situation data region 58 has situation data associated with item data so that the situation data can be retrieved using each item data. The number of input paths is associated with the number ten. The number of generated test vectors is associated with the number five. The distinguishable displays (numbers) of paths successful in generation of test vectors are associated with the numbers of path1, path4, path5, path7 and path8. The numbers of paths which failed in generation of test vectors are associated with the numbers of path2, path3, path6, path9, and path10. And the names of test vectors are associated with the names of pat 1, pat4, pat5, pat7, and pat8.

At STEP S17, the ending-condition judgment section 19 determines whether the test-vector generation information satisfies the ending condition. While the number of generated test vectors for test-vector generation information in FIG. 18 is five, the number of test vectors for the ending condition in FIG. 16 is 20 or more. Accordingly, the test-vector generation information does not satisfy the ending condition. Thus, the processing returns to STEP S13. At STEP S13, a new retrieval condition is designated for updating. At STEP S14, a new path is retrieved and a path-list for the path is generated again. At STEP S15, it is judged whether a path-list for the new path is generated. When the path-list for the new path is generated, the processing proceeds to STEPs S16, S17, S18, and, finally, to STEP S19. Even when the path-list for the new path is not generated, the processing proceeds to STEP S19. At STEP S119, final test-vector generation information is output to the external memory. Furthermore, a final test vector is output to the external memory at STEP S20. One of ordinary skill in the art can observe that the method of this embodiment therefore allows for highly automated test-vector generation.

Example 2 of the First Embodiment

Figure 19:
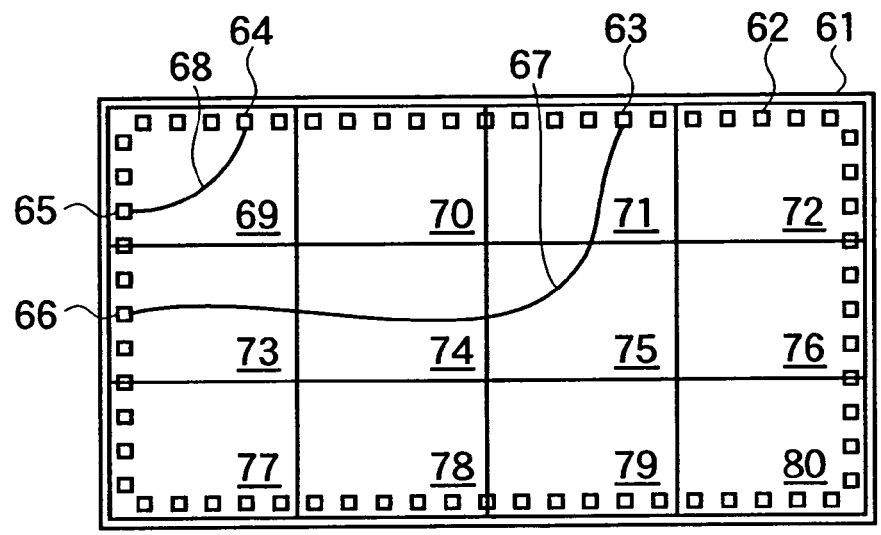
FIG. 19 is a screen image of an IC of a test-vector generating method according to the example 2 of the first embodiment, in which the circuit is divided into regions and the regions can be designated.

The apparatus of this example is similar to that of FIG. 4. Here, STEP S13 of FIG. 3 is expanded. The chip-region designation section 20 generates a screen image 61 of the chip area of the IC, based on logic-circuit information, as shown in FIG. 19. Then, the chip-region designation section 20 generates regions 69–80 which divide the screen image 61, based on the display-image division information. Images of the paths can then be drawn. For example, path 67 is drawn through regions 71, and 73–75. Similarly, path 68 is drawn through region 69.

Figure 20:
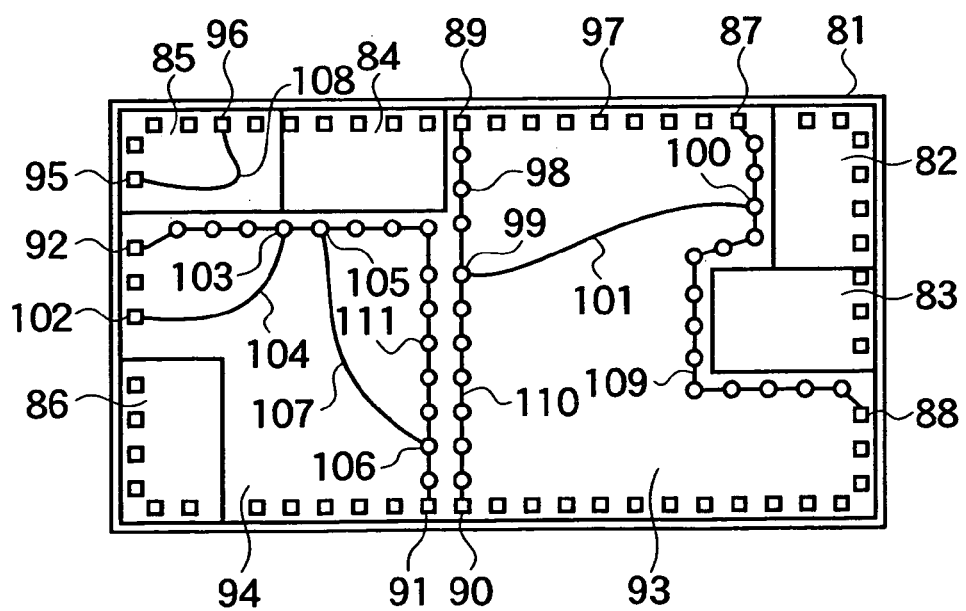
FIG. 20 is a block diagram of the IC of the test-vector generating method according to the example 2 of the first embodiment.

Although the screen image 61 is shown as equally divided into regions 69–80, such need not necessarily be the case, as shown in FIG. 20. Here, the image 81 of the IC is divided into regions 82–86, and 93–94. Image 81 may be divided this way when, for example, regions 82–86 are built in circuit blocks for which test paths have already been provided. As another example, regions 93–94 can be large-scale logic circuits that still require delay fault testing.

The large-scale logic circuit 93 includes: a flip-flop register 100 for scanning; and electrode pads 87, 88 connected to the register 100 through wiring 109. Similarly, the circuit 93 includes: a flip-flop registers 98, 99 for scanning; and electrode pads 89, 90 connected to the registers 98, 99 through wiring 110. A path 101 is provided between the registers 99, 100. A signal cannot be input or output directly to or from the registers 99, 100, different from the electrode pads 87 through 90. Accordingly, a preparation vector, a system-clock vector, and a detection vector are used as a test vector in order to test the path 101. The preparation vector is input from the electrode pads 87, 89 to set initial logic for the registers 99, 100 and the like before the testing. The system clock vector is input from the electrode pads 87, 89, 97, and the like to activate the path 101. The detection vector contains expected values from the testing and is compared with an output vector from the electrode pad 88, comprised of output signals from the activated path 101.

Similarly, the large-scale logic circuit 94 includes: registers 103, 105, 106, 111 and electrode pads 91, 92 connected to the above registers 103, 105, 106, 111 by wiring. The path 104 is provided between the electrode pad 102 and the register 103. A path 107 is provided between the registers 105, 106. A test vector is generated for input or output of a signal to or from the registers 103, 105, 106.

Figure 21:
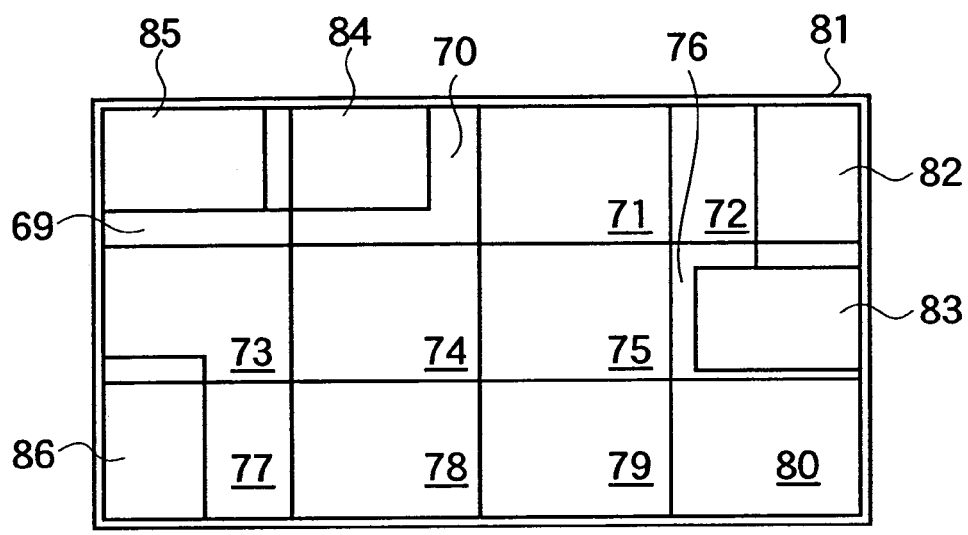
FIG. 21 is a screen image of the IC of the test-vector generating method according to the example 2 of the first embodiment, in which the circuit is divided into regions equally in the vertical and horizontal directions and the regions can be designated.
Figure 22:
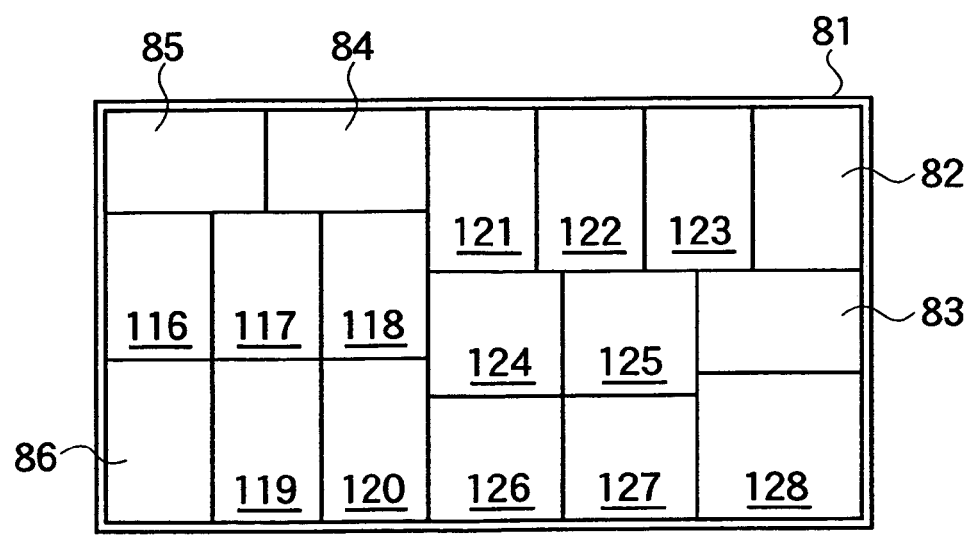
FIG. 22 is a screen image of the IC of the test-vector generating method according to the example 2 of the first embodiment, in which the circuit is divided into regions with equal area and the regions can be designated.

When the large-scale logic circuits 93, 94 are equally divided into regions like that of FIG. 19, large regions 71, 74, 75, 78, 79, 80, and small regions 69, 70, 72, 73, 76, 77 are formed as shown in FIG. 21. The existence of the small regions 69, 76 makes it difficult to control the path for uniformity on the chip. Therefore, the large-scale logic circuits 93, 94 are divided into regions 116–128, as shown in FIG. 22, and non-uniformity among the areas of the regions is reduced when the chip-region designation section 20 directly designates each of the regions.

The chip-region designation section 20 displays screen images of the large-scale logic circuits 93, 94. Using the screen displays, users can divide the screen images of the large-scale logic circuits 93, 94 into regions. The operator is then allowed to divide the image in known fashion. For example, a touch screen can be employed to allow the user to draw out or otherwise describe his or her divisions. The retrieval-condition designation section 11 divides the large-scale logic circuits 93, 94, and generates regions 116–128, based on user input.

Figure 23:
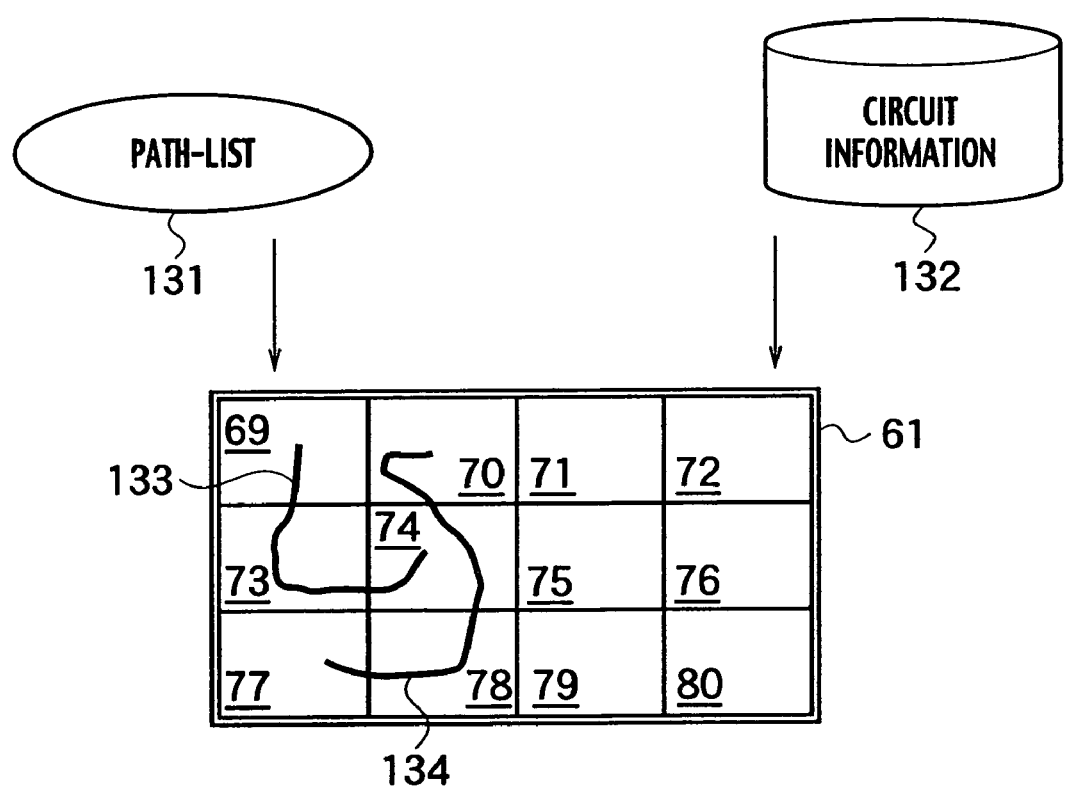
FIG. 23 is an explanatory view of a method by which a screen image of the IC of the test-vector generating method according to the example 2 of the first embodiment is divided into regions, the regions can be designated, and screen images of paths are superposed on the screen image of the circuit.

As shown in FIG. 23, screen images of paths 133, 134 which have already succeeded in generation of a test vector are superposed and displayed, by the chip-region designation section 20, on the screen image 61. Here, the IC has already been divided into regions 69–80. The screen images of the paths 133, 134 can be generated, using a path list 131 and circuit information 132. The screen image of the path 133 is provided so that the image is superposed on the region 69, 73, 74, and the screen image of the path 134 is provided so that the image is superposed on the region 70, 74, 77, 78.

As shown in FIG. 24, the chip-region designation section 20 then defines the coverage (coverage condition) of the regions 69–80 by the paths, 133, 134. The definition of the coverage has a coverage-definition-item-data region 141 and a range data region 142. The item data region 141 includes as item data; the number of paths passing through the region, and the total length of wiring which is connected to the path in each region. The range data region 142 has range data associated with the item data, so that the range data can be retrieved using each item data. In the example of FIG. 24, the total number of paths which pass through the region is associated with a range of three or more, and the total wiring length connected to paths are associated with a range of 2 mm or more.

Figure 27:
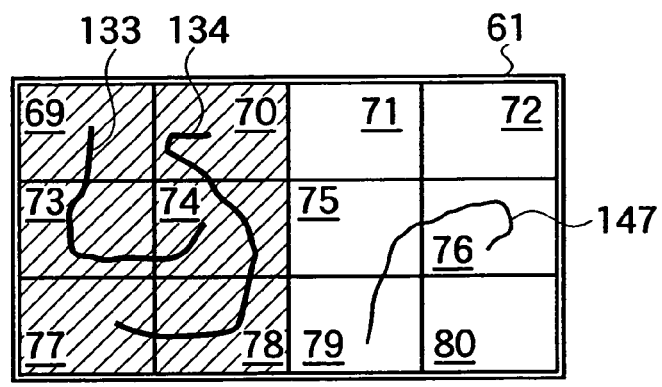
FIG. 27 is an explanatory view of the test-vector generating method according to the example 2 of the first embodiment.

The chip-region designation section 20 verifies that the total wiring length connected to a path with regions 69, 70, 73, 74, 77, 78 is 2 mm or more and the regions 69, 70, 73, 74, 77, 78 are distinguishably hatched for coverage as shown in FIG. 27. Since the number of covered regions 69, 70, 73, 74, 77, 78 is six and the total number is twelve, the coverage rate (i.e., the ratio of covered regions to total regions) is 50%. Here, the displayed path 147 is a path which has failed in generation of a test vector.

An ending-condition designation section 12 generates ending-conditions, as shown in FIG. 26. The ending conditions include item data 145 and a range data 146. The item data 145 includes: a coverage rate; the number of test vectors; and the number of logic elements which the test vectors pass. The range data 146 includes range data associated with item data so that the range data can be retrieved using each item data. The coverage rate is associated with a range of 70% or more. The number of test vectors is associated with a range of 30 vectors or more. And, the number of logic elements which the test vectors passes is associated with a range of 300 gates or more.

The ending-condition judgment section 19 judges that the coverage rate is 50% and does not satisfy the condition of a range of 70% or more. Accordingly, the chip-region designation section 20 generates a retrieval condition shown in FIG. 25. The retrieval condition has a retrieval-condition-item data region 143 and a range data region 144. The item data region 143 has a coverage rate, a total number of steps for the path, and a number of logic elements and of vias through which the test vectors pass, as item data. The range data 144 includes range data associated with item data so that the range data can be retrieved using each item data. The coverage rate is associated with a range of 70% or more. The total number of steps for the path is associated with a range of 7 steps or more. The number of logic elements which the test vectors pass is associated with a range of 200 gates or more. And the number of vias is associated with a range of 500 or more.

Figure 28:
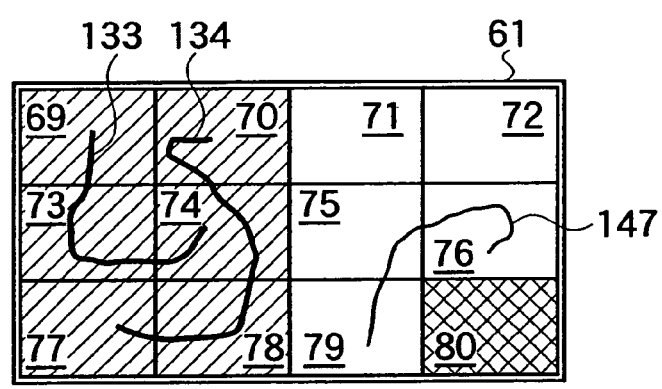
FIG. 28 is an explanatory view of the test-vector generating method according to the example 2 of the first embodiment.
Figure 29:
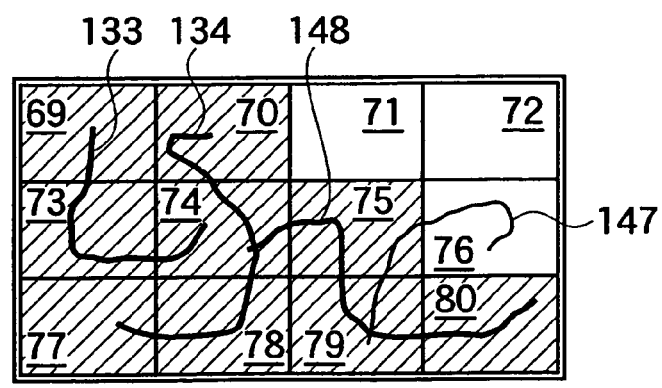
FIG. 29 is an explanatory view of the test-vector generating method according to the example 2 of the first embodiment.

The chip-region designation section 20 requests a user to designate one of divided regions 69–80, as shown in FIG. 27. Assume that the user designates region 80, as shown by the crosshatched area of FIG. 28. The retrieval-condition designation section 11 adds a retrieval condition for retrieving a path through region 80. The path-list generation section 14 then generates a path list which satisfies the revised retrieval condition. After success in generation of a test vector, the test-vector generation section 16 displays the path 148, as shown in FIG. 29.

The chip-region designation section 20 highlights path 148 in such a way that the path 148 can be distinguished from path 147. The chip-region designation section 20 then determines whether the path 148 satisfies the definition of coverage in FIG. 24. Since the total wiring length connected to the path is 2 mm or more with regard to the regions 75, 79, 80, the regions 75, 79, 80 are hatched as a covered region. As can be seen from FIG. 29, the number of covered regions 69, 70, 73 through 75, 77 through 80 goes to nine, and the corresponding coverage rate is 75%.

The ending-condition judgment section 19 then determines whether the ending condition of FIG. 26 is satisfied. Here, since the coverage rate reaches 75% and exceeds the range of 70% or more as the retrieval condition, it is judged that the generation situations of the test vector satisfy the ending condition. Test vector generation is thus ended.

Example 3 of the First Embodiment

The apparatus employed in this example can be similar to that shown in FIG. 5, with some modifications as follows. Here, a retrieval-condition designation section 11 includes a circuit-information setting section 21, a retrieval-priority decision section 22, and a circuit-information changing section 23. This apparatus can perform the methods of FIG. 3, except that STEP S13 can be modified as below.

Figure 30:
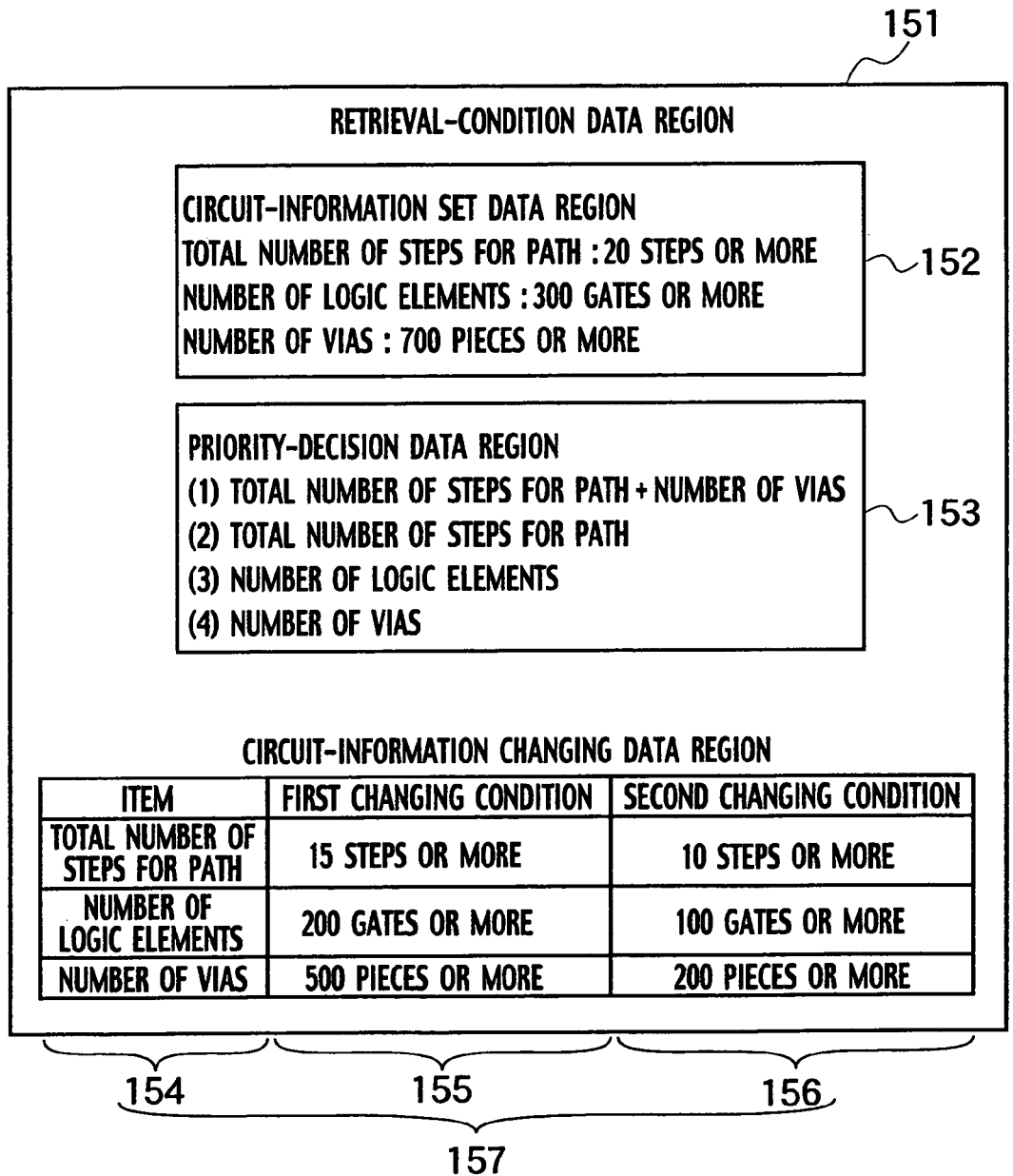
FIG. 30 is a data structure of a retrieval condition for a test-vector generating method according to an example 3 of the first embodiment.

As shown in FIG. 30, circuit-information setting section 21 generates circuit-information set data in a circuit-information set-data region 152. The data structure of the circuit-information set data can be the same as that of the retrieval condition in FIG. 15.

The retrieval-priority decision section 22 generates priority decision data in a priority-decision data region 153. Here, data is arranged in order of the priority, and is also associated so that the item data can be retrieved using the priority. Accordingly, a first retrieval condition is that the total number of steps for the path is 20 steps or more and the number of vias is 700 or more. Moreover, a retrieval condition, which is updated after situations where test-vector generation does not satisfy the ending condition, is only that the total number of steps for the path is 20 steps or more. Moreover, the retrieval condition after updating is only that the number of logic elements is 300 gates or more. Furthermore, the retrieval condition after updating is only that the number of vias is 700 or more.

The circuit-information changing section 23 generates the circuit-information changing data in the circuit information changing data region 157. The data structure of the circuit-information changing data includes: an item data region 154; a first-changing-condition range data region 155; and a second-changing-condition range data region 156. The item data region 154 includes the same item data as that of the item data region in the circuit-information set data region 152. The first-changing-condition range data region 155 is associated so that the first-changing-condition range data can be retrieved, using the item data. The first-changing-condition range data is relieved, in comparison with the range data of the circuit-information set data. Accordingly, a retrieval condition after further updating is that the total number of steps for the path is 15 steps or more and the number of vias is 500 or more. Similarly, the second changing condition can be applied to the retrieval condition.

As described above, a set of test vectors which have been finally generated are repeatable, not depending on operators, because the retrieval condition is relieved according to a predetermined rule.

Example 4 of the First Embodiment

Figures 31, 32, 33:
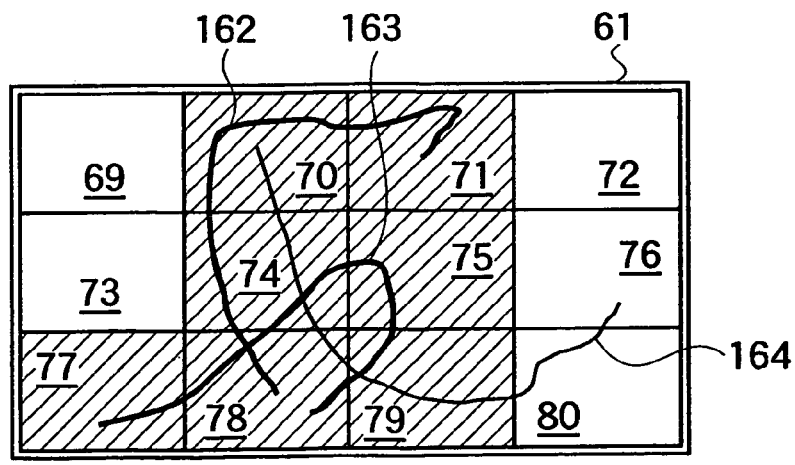
FIG. 31 is a data structure of a pin-name list, including circuit information, for a test-vector generating method according to an example 4 of the first embodiment.
FIG. 32 is a data structure of a delimiter value for a test-vector generating method according to an example 5 of the first embodiment.
FIG. 33 is an explanatory view of a method by which a screen image of paths for the test-vector generating method according to the example 5 of the first embodiment is displayed, based on the delimiter value.

In this example, a test vector generation apparatus is configured similar to that shown in FIG. 8. The apparatus for generating a test vector includes a pin-name-list providing section 25; a circuit-information extraction section 24; a pin-list storage section 26; and a circuit-information for each pin-list storage section 27. The chip-region designation section 20 designates a region on the chip, or the entire chip area. The pin-name-list providing section 25 makes or compiles a pin-name list as shown in FIG. 31. The data structure of the pin-name list includes a pin-name data region 158 and a pin-information data region 159.

The pin-name data region 158 includes, as pin-name data: a cell name; CLTOP/peace/U268/Z representing the pin name of the cell, and the like. The pin-information data region 159 has pin-information data associated so that retrieval can be executed using each pin-name data. The pin-information data is stored in the data region provided for each item. The pin-information data includes, as an item: an X coordinate and a Y coordinate of the pin; a wiring length of wiring connected to the pin; and the number of contacts and vias on a signal transmission line in a cell having the pin.

The circuit-information extraction section 24 extracts and generates circuit information for each pin list, based on the pin-name list, and the retrieval condition. Based on the pin-name list and the circuit information for each pin list, the path-list generation section 14 generates a path list for a new path. It is not required to make a path list, while reading required circuit information from a vast amount of circuit information recorded in the circuit-information storage section 13. The amount of circuit information for each pin list can be reduced to a much smaller amount of information than that of the circuit information recorded in the circuit-information storage section 13. The amount of information can be reduced further, because the circuit information is stored only for the pin-name list.

Example 5 of the First Embodiment

In this example, a test vector generation apparatus is configured similar to that shown in FIG. 9. The apparatus for generating a test vector includes: a path-circuit-information making section 191; a delimiter-value designation section 195; and a highlighted-path selection section 193.

The circuit-information extraction section 24 generates circuit information for each pin list, and the path-circuit-information making section 191 compiles circuit information, which is limited to the region designated by the chip-region designation section 20, from this circuit information.

The delimiter-value designation section 195 sets a delimiter value as shown in FIG. 32. This value lies within the set range for the retrieval items of the retrieval condition in FIG. 25 of the coverage rate and the total number of steps for the path. For example, while the coverage rate of the retrieval condition is 70% or more, the delimiter value is set to be 40% or more. While the total number of steps for the path for the retrieval condition is seven steps or more, the delimiter value is set at five steps or more. The data structure of the delimiter value has an item data region 160 and a range data region 161. The item data region 160 includes coverage rate and number of steps for a path as item data. The range data region 161 includes range data associated with item data so that the range data can be retrieved using each item data. The coverage rate is associated with a range of 40% or more. And the number of steps is associated with a range of five steps.

The highlighted-path selection section 193 generates a path-list for a path satisfying the delimiter value, based on the circuit information for each retrieval item. As shown in FIG. 33, a path 164 (which need not meet the delimiter values) is highlighted so that the path is distinguished from those paths 162, 163 that satisfy the retrieval condition. A guideline for setting the ending condition once again can be easily obtained by retrieving and displaying the path 164 satisfying the delimiter value when the ending condition is not satisfied.

Example 1 of the Second Embodiment

In a fault analysis method of the IC according to an example 1 of the second embodiment, a test execution section 41 executes a delay fault test for the IC at STEP S31, as shown in FIG. 11. When a fail path is generated in the test, the test execution section 41 generates the test result shown in FIG. 34 (STEP S32).

The data structure of the test result has a data region 165 so that a computer can write and read data. The data region 165 includes as data: a serial number of a test such as Test NO. 701; a distinguishable display number of a test vector used for a test such as Pattern Name: Pat1; Pass for the success of a path or Fail for a failed path; delay time measured in a test of Delay Time, such as Delay Time=7.5 nsec; and the like.

Then, a cell-list generation section 43 inputs circuit information on the IC from the circuit-information storage section 33 (STEP S33). At STEP S34, the section 43 generates a cell list shown in FIG. 35 for a failed test vector path. The data structure of the cell list includes a circuit-identifier-name data region 166 and a cell-name data region 167. In the circuit-identifier-name data region 166, the names of circuit-identifiers for cells forming a fail path are arranged in the order of signal transmission of cells. The wiring length of a signal transmission line of cells and the like can then be retrieved as circuit information, using the names of circuit-identifiers for cells. In the cell-name data region 167, cell names of cells forming a fail path are arranged in the order of signal transmission of the cells.

At STEP S35, a retrieval-condition designation section 31 generates a retrieval condition, as shown in FIG. 36, for fault-cell searching, wherein the condition retrieves a path intersecting a portion of the fail path. The data structure of the retrieval condition for fault-cell searching includes a retrieval-condition-item data region 168 and a range data region 169. The item data region 168 includes, as item data: the number of sharing steps; the wiring length; and the number of vias for a path. The range data region 169 includes a range data associated with item data so that the range data can be retrieved using each item data. The number of sharing steps is associated with a range of three steps or more. The wiring length is associated with a range of 1.5 mm or more. And the number of vias for the path is associated with a range of 30 vias or more.

At STEP S36, the ending-condition designation section 32 generates an ending condition for fault-cell searching, as shown in FIG. 37. The data structure of this ending condition includes an ending-condition-item data region 170 and a range data region 171. The item data region 170 includes, as item data: the sharing rate of a path; and the number of test vectors. The sharing rate of a path can be a ratio of the total number of cell steps of a fail path to the number of cell steps of a fail path which shares cell steps with a path for fault-cell searching. The range data region 171 has range data associated with item data so that range data can be retrieved using each item data. The sharing rate of a path is associated with a range of 80% or more. And the number of test vectors is associated with a range of 10 or more.

Figure 38:
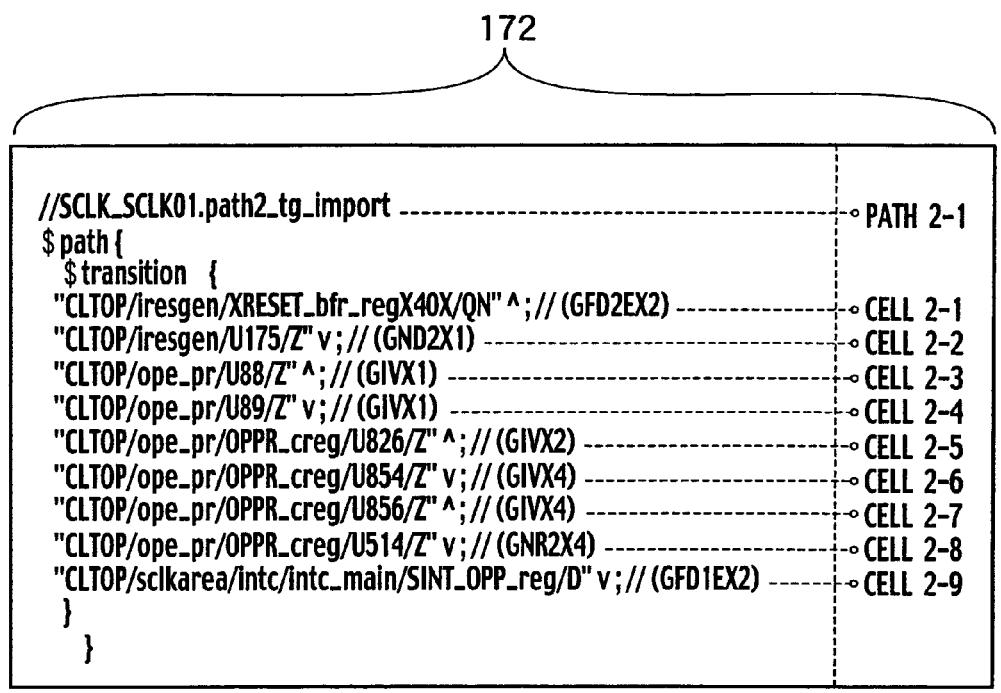
FIG. 38 is a data structure of a path list for the fault analysis method of an IC according to the example 1 of the second embodiment.

At STEP S37, the path-list generation section 34 generates a path list, as shown in FIG. 38, for fault-cell searching for a path, which satisfies the retrieval condition, for fault-cell searching, based on the cell list of the fail path. The path-list for fault-cell searching has a path-list data region 172 so that a computer can write and read data. The path-list data region 172 includes a distinguishable display number of path 2 for a path as leading-line data: Path 2-1. The path-list data region 172 includes a distinguishable display number of (GFD2EX2) for a cell as cell-line data: Cell 2-1. Similarly, the path-list data region 172 includes a distinguishable display number for a cell with regard to cells of Cell 2-2 through Cell 2-9. The Cell 2-1 through Cell 2-9 are arranged in the order of signal transmission of the path of path2. It is understood that the path of path2 has nine steps hereafter. The path of path2 satisfies the retrieval condition in FIG. 36 that the number of sharing steps for the path is three steps or more.

Figure 39:
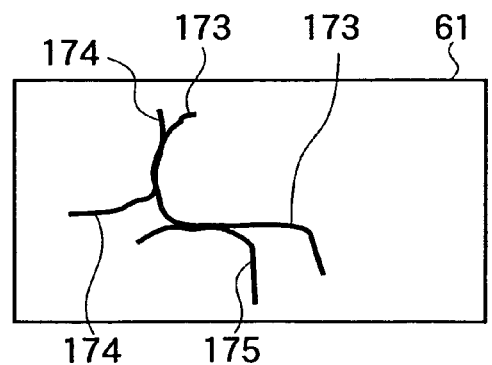
FIG. 39 is an explanatory view of a path with a fault and a path for fault analysis in a test for the fault analysis method according to the example 1 of the second embodiment.

It is judged at STEP S38 whether a new path list for the path is extracted. Since a path list for a new path of path2 is generated, the processing proceeds to STEP S39. At STEP S39, the test-vector generation section 36 generates a test vector for fault-cell searching and vector generation information for each path in the path list for fault-cell searching. According to the vector-generation information, parts of paths 174, 175 for the generated test vector for fault-cell searching have a shared part of a fail path 173, as shown in FIG. 39. Sharing cells exist in the above sharing part.

It is judged in the ending-condition judgment section 39 at STEP S40 whether the vector generation information in FIG. 39 satisfys the ending condition for fault-cell searching in FIG. 37. At STEP S41, the processing returns to STEP S35, because it is judged from the vector-generation information in FIG. 39 that the sharing rate of the path does not reach 80%, and the number of the test vectors is two and does not reach ten.

At STEP S35, the retrieval-condition designation section 31 updates the retrieval condition to a new retrieval condition for fault-cell searching. A new path, which satisfys the updated retrieval condition for fault-cell searching is retrieved to generate a path-list and a test vector for the path for fault-cell searching. When the vector generation information satisfies the ending condition for fault-cell searching, the generated test vector is output to an external memory.

As described above, the test-vector generating method for fault analysis of the delay fault path can be highly automated by generating the test vector of the path for fault-cell searching, based on the cell list of the fail path, the retrieval condition for fault-cell searching, and the ending condition. Furthermore, the quality of the generated test vector for fault-cell searching can be improved to be much more uniform.

Example 2 of the Second Embodiment

A fault analysis apparatus of the IC according to example 2 of the second embodiment is provided with a pin-coordinate storage section 51, as shown in FIG. 13. The cell-list generation section 43 generates pin-coordinate information, as shown in FIG. 40, of an input/output pin of a cell forming a fail path, based on the placing and routing of layout information of the cell. The pin-coordinate storage section 51 stores the pin-coordinate information. The pin-coordinate information includes a cell-list data region 176 for a fail path, and a pin-coordinate data region 177 for a cell. The cell-list data region 176 has the names of circuit-identifiers for cells forming a cell list. The pin-coordinate data region 177 for the cells has an X coordinate and a Y coordinate associated in such a way that retrieval can be performed, using each cell name.

Fault testing of ICs sometimes employs electron beams to irradiate the chip, generating voltages that can be analyzed. In this test method, pin-coordinate information is very useful for proper positioning of the electron beams on the input/output pin of the cell. According to this test method, the pin-coordinate information is automatically generated as fail-path information.

Example 3 of the Second Embodiment

This example expands STEP S35 of FIG. 11, as illustrated in FIG. 8. Here, the retrieval-condition designation section 31 includes a circuit-information setting section 21; a retrieval-priority decision section 22; and a circuit-information changing section 23.

Figure 41:
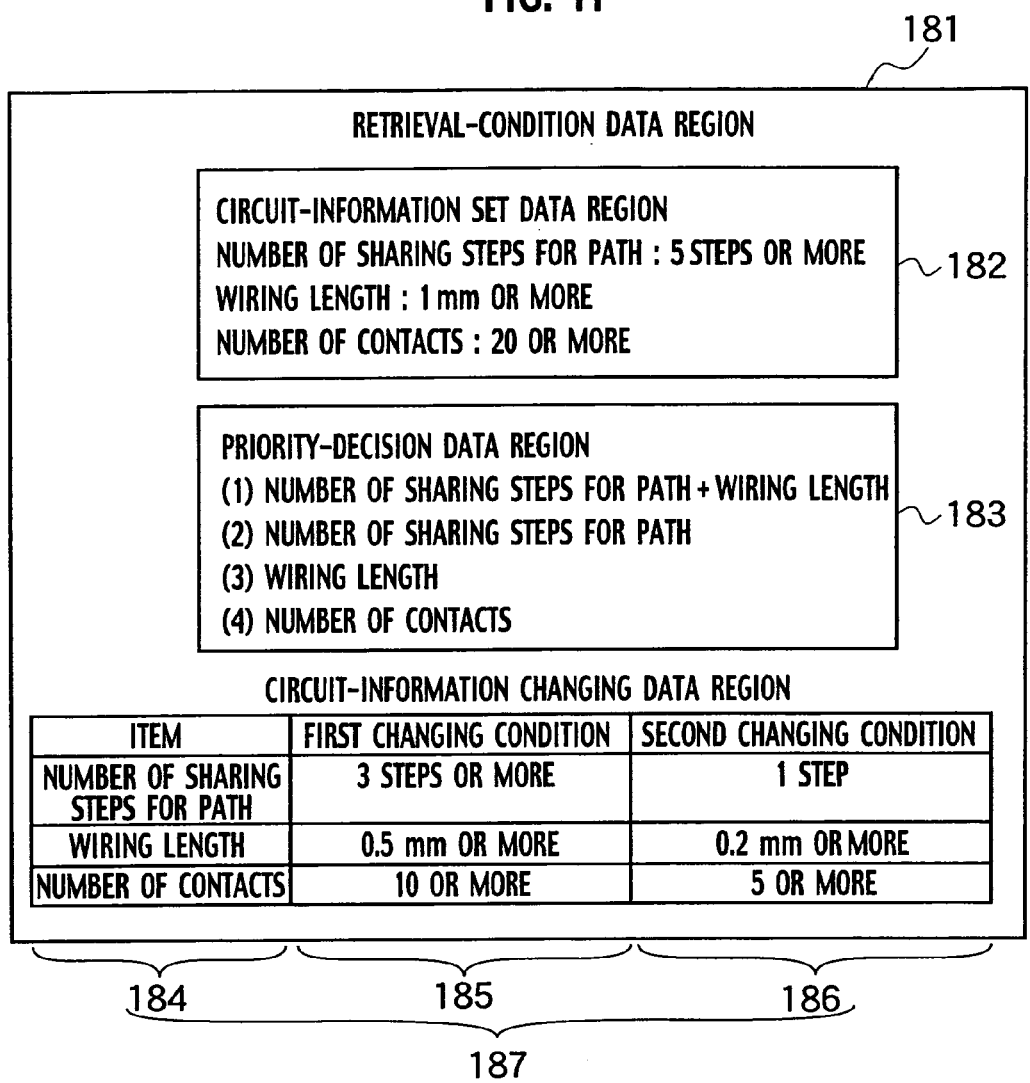
FIG. 41 is a data structure of a retrieval condition for a fault analysis method of an IC according to an example 3 of the second embodiment.

The circuit-information setting section 21 generates circuit-information set data in a circuit-information set data region 182 of the retrieval-condition data region 181, as shown in FIG. 41. The data structure of the circuit-information set data includes an item data region and a range data region. The item data region includes the number of sharing steps; the wiring length; and the number of contacts for the path. The range data region has range data associated with item data so that the range data can be retrieved using each item data. The number of sharing steps is associated with a range of five steps or more. The wiring length is associated with a range of 1 mm or more. And the number of contacts for the path is associated with a range of 20 contacts or more.

The retrieval-priority decision section 22 generates priority decision data in a priority-decision data region 183 of the retrieval-condition data region 181. In the data structure of the priority-decision data, the item data of the circuit-information set data is arranged in the order of the priority and is associated so that the item data can be retrieved, using the priority. Accordingly, a first retrieval condition is that the number of sharing steps for the path is five steps or more and the wiring length is 1 mm or more. Moreover, an updated retrieval condition is only that a number of sharing steps for the path is five steps or more. Furthermore, the retrieval condition after updating is only that the wiring length is 1 mm or more. Moreover, the retrieval condition after updating is only that the number of contacts is 20 contacts or more.

The circuit-information changing section 23 generates the circuit-information changing data in the circuit information changing data region 187 of the retrieval-condition data region 181 of the retrieval condition. The data structure of the circuit-information changing data includes: an item data region 184; a first-changing-condition range data region 185; and a second-changing-condition range data region 186. The item data region 184 includes the same item data as that of the item data region in the circuit-information set data region 182. The first-changing-condition range data region 185 is associated so that the first-changing-condition range data can be retrieved, using the item data. The first-changing-condition range data is relaxed, in comparison with the range data of the circuit-information set data. Accordingly, a retrieval condition after further updating is that the number of sharing steps is three steps or more, the wiring length is 0.5 mm or more, and the number of contacts for the path is 10 contacts or more. Similarly, the second changing condition can be applied to the retrieval condition.

As described above, a set of test vectors which have been finally generated can be repeated, not depending on operators, because the retrieval condition is relaxed according to a predetermined rule.

Figure 42:
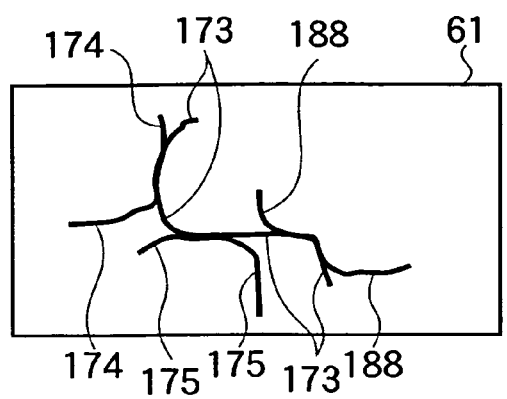
FIG. 42 is an explanatory view of a path with a fault and a path for fault analysis in a test for the fault analysis method according to the example 3 of the second embodiment.

At every updating of the retrieval condition, a test vector for fault-cell searching, and vector-generation information for each path in a path list for fault-cell searching, are generated. According to the vector-generation information, the paths 174, 175 were retrieved for the fail path 173, using the retrieval condition in the circuit-information set data region 182. A test vector was then generated, as shown in FIG. 42. Moreover, the retrieval condition was relaxed for updating, a path 188 was retrieved under the first changing condition 185 in the circuit-information changing data region 187, and a test vector was generated.

Thus, a path is retrieved under a suitable condition for fault analysis as a path retrieving method and a test vector is generated. When a temporarily generated test vector is judged to be unsuitable for analysis, a vector best suited for fault analysis will be obtained by addition of a test vector after changing a retrieval condition.

Example 4 of the Second Embodiment

Figure 43:
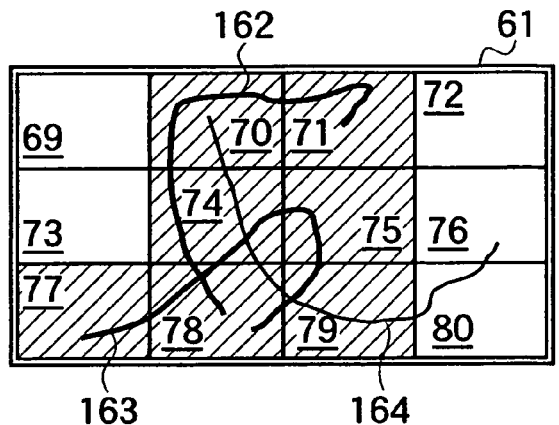
FIG. 43 is an explanatory view of a fault analysis method of an IC according to an example 4 of the second embodiment.

This example can employ an apparatus similar to that of FIG. 14. Operation of the apparatus according to this example is illustrated in FIG. 43. First, a chip-region designation section 50 reads information on the logic circuits of the IC from a circuit-information storage section 33 and displays an image of a chip 61. The chip-region designation section 50 divides the image of the chip 61 into regions 69 through 80 and generates divided-region information including shapes, sizes, and arrangement positions of the regions 69 through 80. Then, based on the divided-region information, images of the regions 69 through 80 are superposed and displayed on the image of the chip 61. In this example, the image of the chip 61 is divided into three equal divisions in the vertical direction and four in the horizontal direction.

Data for a success path 164 (i.e., without failure) and fail data for fail paths 162, 163 are input to the chip-region designation section 50 from a fail-data storage section 42. Images of the physical positions of the successful path 164 and the fail paths 162, 163 can then be displayed on the image of the chip 61.

Figure 44:
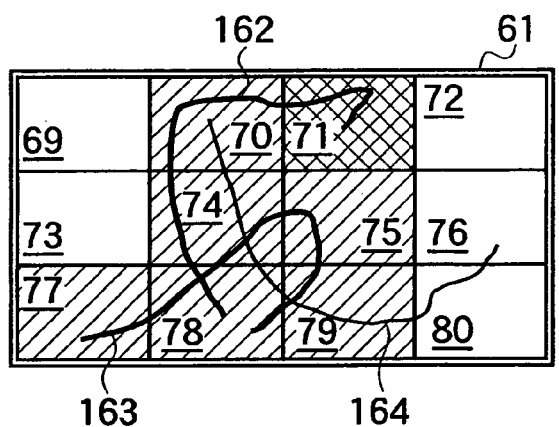
FIG. 44 is an explanatory view of the fault analysis method of the IC according to the example 4 of the second embodiment.

By the chip-region designation section 50 can designate covered regions 70, 71, 74, 75, 77 through 79 a different display color (assuming, for instance, that a region is defined to be a covered region when the fail paths 162, 163 pass even a part of the region). To do so, the chip-region designation section 50 requests the operator to designate and input desired regions. As shown in FIG. 44, the operator inputs the desired region 71 into the chip-region designation section 50. The chip-region designation section 50 outputs the desired region 71 to a retrieval-condition designation section 31, which sets a new retrieval condition that will cover the region 71.

Figure 45:
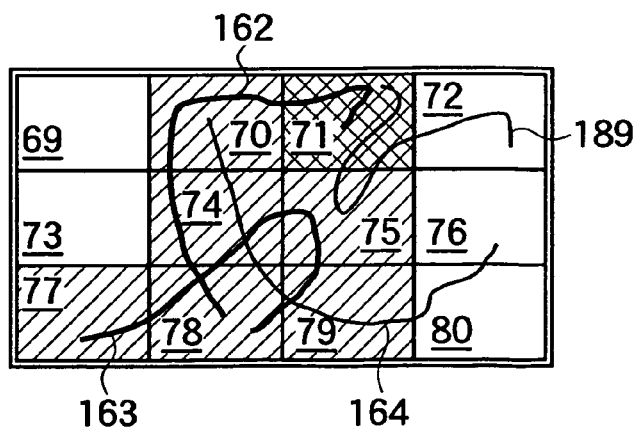
FIG. 45 is an explanatory view of the fault analysis method of the IC according to the example 4 of the second embodiment.

Based on the new retrieval condition, a path-list generation section 34 retrieves the path 189 shown in FIG. 45, and generates a path-list for the path 189. A test-vector generation section 36 generates a test vector and a vector generation information for the generated path-list. The chip-region designation section 50 displays an image of the new path 189 for fault-cell searching, based on the vector-generation information.

In this manner, operators can see generated paths and designate new retrieval conditions based on these paths. This increases the accuracy of delay fault testing.

Example 5 of the Second Embodiment

Figure 46:
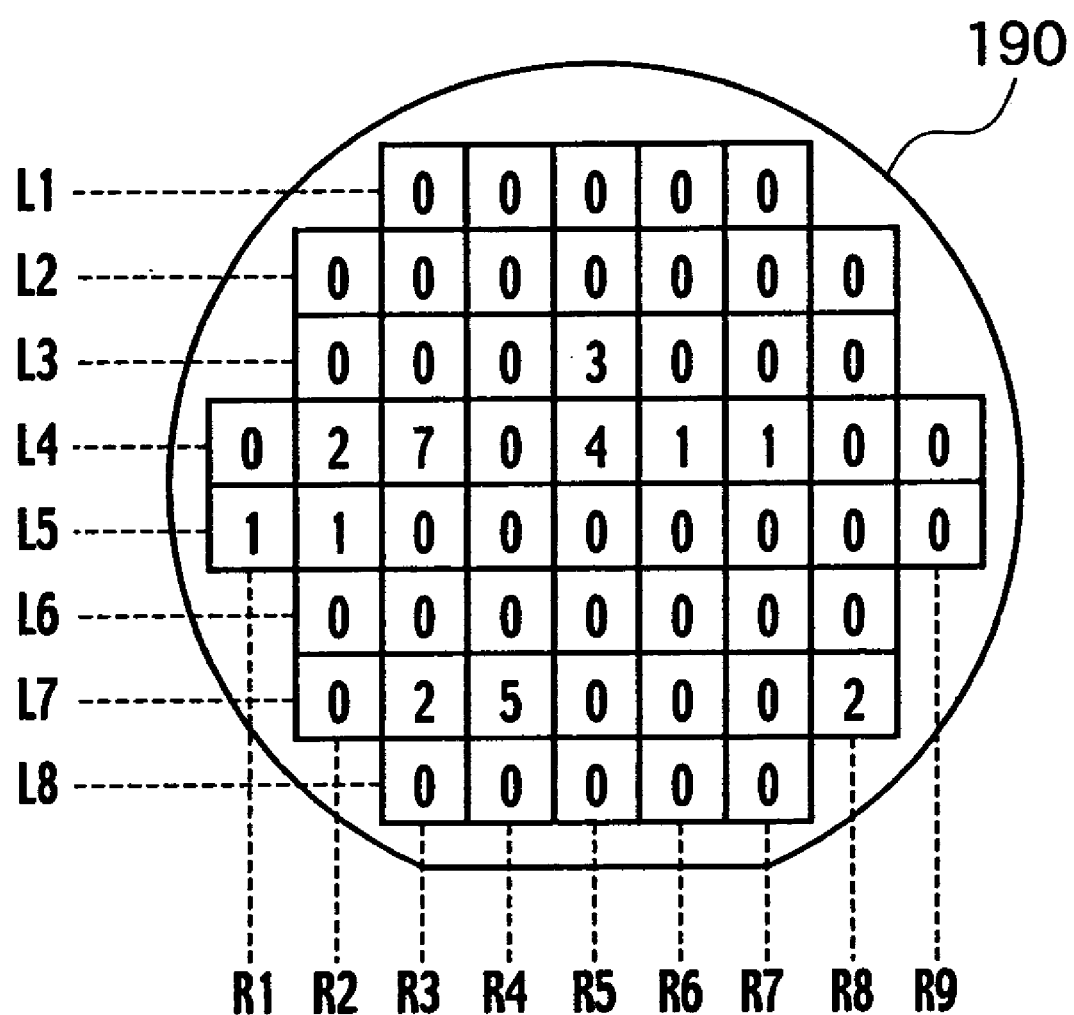
FIG. 46 is an explanatory view of wafer distribution of an IC having paths with a fault in a test for a fault analysis method of an IC according to an example 5 of the second embodiment.

Delay fault testing for a path is executed for each chip. A chip-region designation section 50 summarizes fail information for each tested chip on the wafer 190, and displays the fail information along with the position of each chip on the wafer 190, as shown in FIG. 46. The fail information is the number of fail paths for each chip on the wafer 190. The operator can confirm distribution of fail paths on the wafer 190. For example, seven fail paths are generated in the chip marked by line L4 and row R3. Displays such as that shown in FIG. 46 allow for easy identification of patterns of fail paths, as well as potential causes (e.g., certain phenomena are known to result in certain characteristic failure patterns). Alternatively, individual regions can be color-coded according to the number of fail paths they contain. Furthermore, the presence of specific fail paths which pass through a plurality of wafers 190 may be listed among the fail information. And, a chip is divided into smaller regions and a number of fail paths for each region or a zone corresponding to the number of fail paths can be displayed, in the case of displaying each wafer.

In addition to the above embodiments, fail information can be displayed for each lot or for a plurality of lots. That is, fail paths are collected and counted for each IC to one wafer, each wafer to one lot, or each lot to a plurality of lots. An IC, a wafer, or a lot may be distinguishably displayed, corresponding to the counted number.

Thus, according to testing of a plurality of ICs, statistics of measured values of delay time can be collected for paths in the logic circuits which are targets of each test vector. Ratios between the measured values and calculated values used for timing analysis or for simulation at generating test vectors for delay path tests are obtained and each path may be distinguishably displayed, corresponding to the ratio. Thereby, differences between measured values for a real chip and calculated values used for timing analysis and simulation can be easily confirmed.

Various modifications will become possible for those skilled in the art after receiving the teachings of the present disclosure without departing from the scope thereof.

What is claimed is:

1. An apparatus for generating a test vector of a semiconductor integrated circuit, comprising:
   a retrieval-condition designation section designating a retrieval condition configured to select a path on which a signal can be transmitted in the semiconductor integrated circuit;
   a path-list generation section executing a timing analysis of the semiconductor integrated circuit based on circuit information of the semiconductor integrated circuit, retrieving the path satisfying the retrieval condition, and generating a path list in which cells composing the retrieved path are ordered according to the timing analysis;
   a test-vector generation section generating a test vector configured to test a path delay fault of the semiconductor integrated circuit based on the path list;
   an ending-condition designation section designating an ending condition configured to end generation of the test vector when the path in the path list for the test vector covers the semiconductor integrated circuit; and
   an ending-condition judgment section stopping generation of the path list when the ending condition is satisfied.

2. The apparatus as claimed in claim 1, wherein the ending-condition designation section comprises:
   a coverage-judging-condition designation section dividing the semiconductor integrated circuit into a plurality of regions and designating a condition configured to judge that the path covers the region; and
   a coverage-rate definition section designating a coverage rate as a ratio of the number of the regions which are judged to be covered to the total number of the regions.

3. The apparatus as claimed in claim 2, wherein the retrieval-condition designation section comprises a region designation section displaying a screen image of the semiconductor integrated circuit divided into the regions, requesting designation of the region based on the screen image, and designating the retrieval condition by which the path covering the designated region can be retrieved.

4. The apparatus as claimed in claim 1, wherein the retrieval-condition designation section comprises a circuit-information setting section setting a retrieval item concerning the circuit information and a setting range within which the path is retrieved corresponding to the retrieval item, and the apparatus further comprises one of:
   a retrieval-priority decision section deciding priorities among the items to be satisfied by the path to be retrieved; and
   a circuit-information changing section relieving the set range in the circuit-information setting section and generating the path list when the ending condition is not satisfied.

5. The apparatus as claimed in claim 1, wherein the retrieval condition includes a circuit-information condition having a retrieval item concerning the circuit information and a set value defining a range within which the path is retrieved corresponding to the retrieval item, and the apparatus further comprises one of: a retrieval-order condition including priorities among the retrieval items to be satisfied by the path to be retrieved; and a circuit-information changing condition relieving the set value and generating the path list when the ending condition is not satisfied.

6. The apparatus as claimed in claim 2, further comprising: a pin-name-list making section making a pin-name list extracting pin names of the cells in the designated regions based on placing and routing of layout information on the cells in the circuit information on the designated regions; and a circuit-information extraction section extracting the circuit information of the retrieval items by each of the pin-name list.

7. The apparatus as claimed in claim 6, wherein the path-list generation section executes timing analysis and retrieves a path covering the designated regions based on the pin-name list and the circuit information for each of the retrieval items.

8. The apparatus as claimed in claim 6, further comprising: a path-circuit-information making section making the circuit information for each of the retrieval items of the path covering the designated regions based on the circuit information for each of the extracted retrieval items; a delimiter-value designation section setting a delimiter value within the setting range and dividing the setting range into a plurality of zones by the delimiter value; and a distinguished-path displaying section distinguishably displaying the path in each of the zones to which the circuit information for each of the retrieval items of the path belongs and superposing the path on a screen image of the semiconductor integrated circuit.

9. An apparatus for analyzing a failure in a semiconductor integrated circuit, comprising:
   a cell-list generation section generating a list of cells composing a path in the semiconductor integrated circuit with a delay fault based on a test result of whether the delay fault is generated on the path;
   a retrieval-condition designation section designating a retrieval condition configured to retrieve a fault-cell searching path, which includes a part of the path with the delay fault;
   a path-list generation section for fault-cell searching, which retrieves the fault-cell searching path based on the retrieval condition, and generates a fault-cell searching path list in which cells composing the retrieved fault-cell searching path are ordered according to the transmission of a signal by the cells composing the retrieved fault-cell searching path;
   a test-vector generation section for fault-cell searching, which generates a test vector based on the fault-cell searching path list; an ending-condition designation section designating an ending condition configured to end generation of the test vector; and an ending-condition judgment section stopping generation of the path list when the ending condition is satisfied.

10. The apparatus as claimed in claim 9, wherein the ending condition includes at least one of a condition that a number of generated test vectors exceeds a predetermined number, and a condition that, for each of the generated path lists, at least one attempt has been made to generate a corresponding test vector.

11. The apparatus as claimed in claim 9, wherein a fail path segment along the screen image of the path with the delay fault is displayed in a distinguishable manner from a screen image of the semiconductor integrated circuit including a screen image of the path with the delay fault.

12. The apparatus as claimed in claim 11, wherein a fault-cell searching path segment along the fault-cell searching path is configured to be distinguished from the screen image of the semiconductor integrated circuit, the screen image of the path with the delay fault, and the fail path segment.

13. The apparatus as claimed in claim 9, wherein the retrieval-condition designation section comprises a circuit-information setting section setting a retrieval item concerning the circuit information and a setting range within which the path is retrieved corresponding to the retrieval item, and the apparatus further comprises one of: a retrieval-priority decision section deciding priorities among the items to be satisfied by the path to be retrieved; and a circuit-information changing section relieving the set range in the circuit-information setting section and more easily generating the path list when the ending condition is not satisfied.

14. The apparatus as claimed in claim 9, wherein the retrieval condition includes a circuit-information condition having a retrieval item concerning the circuit information and a set value defining a range within which the path is retrieved corresponding to the retrieval item, and the apparatus further comprises one of: a retrieval-order condition including priorities among the retrieval items to be satisfied by the path to be retrieved; and a circuit-information changing condition relieving the set value and generating the path list when the ending condition is not satisfied.

15. The apparatus as claimed in claim 9, wherein pin-coordinate information of an input/output pin of the cells composing the path with the delay fault is generated based on a placing and routing of layout information in the circuit information on the semiconductor integrated circuit.

16. The apparatus as claimed in claim 11, wherein the semiconductor integrated circuit is divided into a plurality of regions, and the regions are displayed and distinguished from each other according to the number of the fault paths with the delay fault covering the regions respectively.

17. The apparatus as claimed in claim 9, wherein numbers of the paths with the delay fault are counted for each semiconductor integrated circuit on one wafer, each wafer of one lot, or each lot in a plurality of lots, and the semiconductor integrated circuit, the wafer, or the lot is displayed and distinguished from each other according to the numbers of paths with delay faults.

18. The apparatus as claimed in claim 12, wherein one of the fail path segment and the fault-cell searching path segment is highlighted according to a ratio of one of a measured value of a delay time for the path with the delay fault and a measured value of a delay time measured with the test vector to a calculated value of the delay time respective.

19. A computer-implemented method for generating a test vector of a semiconductor integrated circuit comprising:
   designating a retrieval condition configured to select a path on which a signal can be transmitted in the semiconductor integrated circuit;
   executing a timing analysis of the semiconductor integrated circuit based on circuit information of the semiconductor integrated circuit, retrieving the path satisfying the retrieval condition, and generating a path list in which cells composing the retrieved path are ordered according to the timing analysis;
   generating a test vector configured to test a path delay fault of the semiconductor integrated circuit based on the path list;
   designating an ending condition configured to end generation of the test vector when the path in the path list for the test vector covers the semiconductor integrated circuit; and
   stopping generation of the path list when the ending condition is satisfied.

20. A computer program product to be executed by a computer for generating a test vector of a semiconductor integrated circuit comprising:
   instructions designating a retrieval condition configured to select a path on which a signal can be transmitted in the semiconductor integrated circuit;
   instructions executing a timing analysis of the semiconductor integrated circuit based on circuit information of the semiconductor integrated circuit, retrieving the path satisfying the retrieval condition, and generating a path list in which cells composing the retrieved path are ordered according to the timing analysis;
   instructions generating a test vector configured to test a path delay fault of the semiconductor integrated circuit based on the path list;
   instructions designating an ending condition configured to end generation of the test vector when the path in the path list for the test vector covers the semiconductor integrated circuit; and
   instructions stopping generation of the path list when the ending condition is satisfied.

* * * * *